US012772529B2

(12) United States Patent
Otto, IV et al.

(10) Patent No.: US 12,772,529 B2
(45) Date of Patent: Oct. 20, 2026

(54) METHOD FOR SEMICONDUCTOR MANUFACTURING

(71) Applicant: Tokyo Electron Limited, Tokyo (JP)

(72) Inventors: Ivo Otto, IV, Albany, NY (US); Toshiki Kanaki, Albany, NY (US); Subhadeep Kal, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 394 days.

(21) Appl. No.: 18/601,655

(22) Filed: Mar. 11, 2024

(65) Prior Publication Data

US 2025/0287668 A1 Sep. 11, 2025

(51) Int. Cl.

| | |
|---|---|
| ***H01L 29/66*** | (2006.01) |
| ***H01L 21/306*** | (2006.01) |
| ***H01L 21/322*** | (2006.01) |
| ***H10D 30/01*** | (2025.01) |
| ***H10D 64/01*** | (2025.01) |
| ***H10P 36/00*** | (2026.01) |
| ***H10P 50/64*** | (2026.01) |

(52) U.S. Cl.

CPC ......... *H10D 64/018* (2025.01); *H10D 30/014* (2025.01); *H10P 36/00* (2026.01); *H10P 50/642* (2026.01)

(58) Field of Classification Search

CPC .. H10D 30/501; H10D 30/502; H10D 30/506; H10D 30/504; H10D 30/503; H10D 30/507; H10D 30/508; H10D 30/509; H10D 62/113; H10D 62/115; H10D 62/116; H10D 62/118; H10D 62/119; H10D 62/121; H10D 62/122; H10D 62/123; H10D 62/822; H10D 64/018; H10D 64/025

See application file for complete search history.

(56) References Cited

U.S. PATENT DOCUMENTS

| | | |
|---|---|---|
| 9,607,855 B2 | 3/2017 | Takahashi et al. |
| 9,954,058 B1 | 4/2018 | Mochizuki |
| 9,997,598 B2 | 6/2018 | Smith et al. |

(Continued)

FOREIGN PATENT DOCUMENTS

| | | |
|---|---|---|
| KR | 20240022102 A | 2/2024 |
| WO | 2021066951 A1 | 4/2021 |

OTHER PUBLICATIONS

International Searching Authority, "Notification of Transmittal of the International Search Report and the Written Opinion of the International Searching Authority, or the Declaration", International application No. PCT/US2025/011877, Date of mailing May 2, 2025, 9 pages.

(Continued)

*Primary Examiner* — Lawrence C Tynes, Jr.
(74) *Attorney, Agent, or Firm* — Slater Matsil, LLP

(57) ABSTRACT

A method of processing a substrate includes forming a recess by etching a sacrificial layer, forming an inner spacer in the recess, and forming a source/drain region. The sacrificial layer is between a lower nanosheet and an upper nanosheet. The source/drain region is formed adjacent the lower nanosheet, the inner spacer, and the upper nanosheet. The method further includes removing the sacrificial layer with an etch process and performing an oxidation on a portion of the source/drain region through the inner spacer.

20 Claims, 18 Drawing Sheets

(56) References Cited

U.S. PATENT DOCUMENTS

| | | | |
|---|---|---|---|
| 11,699,741 | B2 | 7/2023 | Yoshida et al. |
| 2016/0379835 | A1 | 12/2016 | Kal et al. |
| 2019/0287864 | A1 | 9/2019 | Cheng |
| 2020/0066839 | A1* | 2/2020 | Zhang .................... B82Y 10/00 |
| 2020/0098860 | A1 | 3/2020 | Cheng et al. |
| 2022/0037465 | A1* | 2/2022 | Lin ...................... H10D 30/014 |
| 2022/0052203 | A1 | 2/2022 | More |
| 2023/0317465 | A1 | 10/2023 | Hajibabaeinajafabadi et al. |
| 2024/0055268 | A1 | 2/2024 | Otto, IV et al. |
| 2025/0120123 | A1* | 4/2025 | Lu ........................ H10D 30/014 |

OTHER PUBLICATIONS

Mertens, H. et al., "Si-cap-free SiGe p-Channel FinFETs and Gate-All-Around Transistors in a Replacement Metal Gate Process: Interface Trap Density Reduction and Performance Improvement by High-Pressure Deuterium Anneal," 2015 Symposium on VLSI Technology Digest of Technical Papers, Jun. 16-18, 2015, 2 pages.

Li, J. et al., "A Novel Dry Selective Isotropic Atomic Layer Etching of SiGe for Manufacturing Vertical Nanowire Array with Diameter Less than 20nm," Materials, vol. 13, No. 771, Feb. 7, 2020, 11 pages.

Mukesh, S. et al., "A Review of the Gate-All-Around Nanosheet FET Process Opportunities," Electronics, vol. 11, No. 3589, MDPI, Nov. 3, 2022, 11 pages.

* cited by examiner

METHOD FOR SEMICONDUCTOR MANUFACTURING

TECHNICAL FIELD

The present invention relates generally to semiconductor manufacturing, and, in particular embodiments, to methods of processing a substrate.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using various deposition and etch techniques such as plasma processes.

The semiconductor industry has traditionally followed Moore's Law, which was initially based on the observation that the number of transistors on a chip doubles approximately every two years, leading to a cadence of shrinking feature sizes (also referred to as "scaling") along with improvements in performance and reductions in costs. However, as transistor features approached atomic dimensions, maintaining this pace has become increasingly challenging. As a result, the scaling cadence has evolved from a strict focus on gate length reduction to a more complex one incorporating innovations in 3D structures, new materials, and integration methods.

Nanosheet transistors have emerged as a promising advancement in this endeavor, representing a significant evolution from their planar and FinFET predecessors. Nanosheet transistors, characterized by their multiple horizontal sheets, or 'nanosheets', of channel material stacked vertically, allow for enhanced control over the current flow and offer the potential for further scaling beyond the limits of conventional FinFET architectures. These devices can effectively maintain excellent electrostatic control over a channel and enable gate-all-around (GAA) configurations, which are imperative for next-generation integrated circuits and high-performance computing applications. Despite the advantages of nanosheet transistors, challenges remain in fabrication techniques, uniformity across large wafers, thermal management, and integration with existing manufacturing processes.

SUMMARY

In accordance with an embodiment, a method of processing a substrate includes: forming a recess by etching a sacrificial layer, the sacrificial layer being between a lower nanosheet and an upper nanosheet; forming an inner spacer in the recess; forming a source/drain region adjacent the lower nanosheet, the inner spacer, and the upper nanosheet; removing the sacrificial layer with an etch process; and performing an oxidation on a portion of the source/drain region through the inner spacer.

In accordance with another embodiment, a method of processing a substrate includes: forming a first layer stack and a second layer stack, the first layer stack including alternating layers of first nanosheets and first sacrificial layers, the second layer stack including alternating layers of second nanosheets and second sacrificial layers, the second layer stack being wider than the first layer stack; performing a first channel release process on the first layer stack and the second layer stack, the first channel release process removing the first sacrificial layers from the first layer stack and a portion of the second sacrificial layers from the second layer stack; performing an oxidation on a portion of a source/drain region, the source/drain region being adjacent the first layer stack; and performing a second channel release process on the second layer stack, the second channel release process removing the remaining portion of the second sacrificial layers.

In accordance with yet another embodiment, a method of processing a substrate includes: forming a first layer stack and a second layer stack, the first layer stack and the second layer stack each including alternating layers of silicon (Si) layers and silicon-germanium (SiGe) layers, the first layer stack being wider than the second layer stack; forming indents between the Si layers of the first layer stack and the second layer stack by etching a portion of the SiGe layers selectively to the Si layers; forming respective inner spacers in the indents of the first layer stack and the second layer stack; epitaxially growing a first source/drain region adjacent the first layer stack and a second source/drain region adjacent the second layer stack; removing a portion of the SiGe layers of the first layer stack and the SiGe layers of the second layer stack with a first etch process; forming oxidized regions in the second source/drain region through respective inner spacers of the second layer stack; and removing the remaining portion of the SiGe layers of the first layer stack with a second etch process.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Methods of reducing or preventing damage to source/drain regions (in other words, to source regions and drain regions) during channel release processes. Generally, fabricating complicated structures for advanced semiconductor devices, for example 3-D devices such as gate-all-around field effect transistors (GAAFETs, also referred to as nanosheet or nanowire FETs) and stacked FETs (also referred to as complementary FETs or CFETs), may require laterally removing materials to selectively expose a portion of the underlying structure. However, it may be challenging to achieve sufficient etch selectivity in certain processes due to the small scale and design complexity of the features to be fabricated.

Figure 1A:
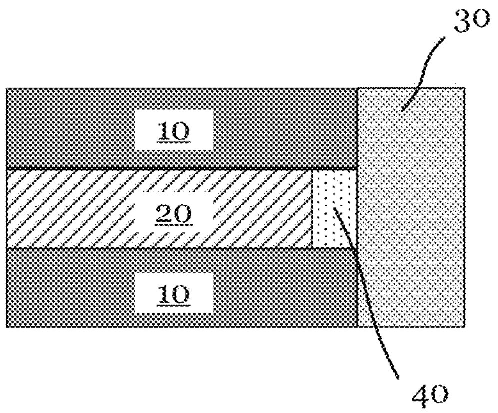
FIG. 1A (PRIOR ART)
FIGS. 1A and 1B illustrate cross-sectional views of an example substrate.

One example of such difficult etch processes is a channel release process for a nanosheet/nanowire p-channel FET (pFET), where the insufficient etch selectivity may cause significant damage to source/drain regions. Commonly, as illustrated in FIG. 1A, a layer stack of silicon (Si) nanosheets 10 and sacrificial layers 20 is formed to provide multiple Si nanosheet/nanowire channels. Source/drain materials 30 are then epitaxially grown, such as from the tips of the Si nanosheet/nanowire and/or from an adjacent recess in an Si substrate. In typical examples, the source/drain materials 30 comprise boron-doped silicon-germanium (B-doped SiGe) and the sacrificial layers 20 comprise un-doped SiGe.

Figure 1B:
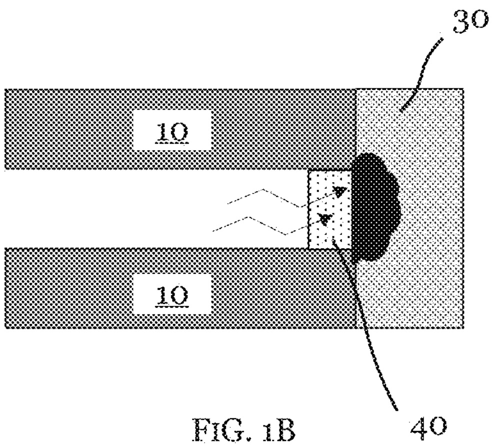
FIG. 1B (PRIOR ART)

During the channel release process, the sacrificial layers 20 are removed by dry etching. An inner spacer 40 is used to separate the sacrificial layers 20 from the source/drain materials 30 in order to protect the source/drain materials 30 during the channel release process. However, as illustrated in FIG. 1B with arrows, the etch gas used in the conventional channel release process may penetrate the inner spacer 40 to reach and damage the source/drain materials 30. Although the inner spacer 40 may be in principle chemically resistant to the etch gas and able to provide etch selectivity, the penetration of the etch gas may still occur because the inner spacer 40 is typically scaled to a small thickness and made porous to reduce its dielectric constant in order to minimize the parasitic capacitance caused by the inner spacer 40. Therefore, a new solution for channel release processes that reduce or prevent source/drain region damage is desirable.

According to one or more embodiments of the present disclosure, methods of semiconductor manufacturing include selective oxidation of portions of source/drain regions and subsequent channel release selective to the oxidized portions of the source/drain regions. Surface layers of source/drain regions may be selectively oxidized through inner spacers to reduce or prevent damage to the source/drain regions that may occur during over-etching. For example, during channel release processes for devices including both short channel and long channel nanosheet stacks, over-etching may be used in order to remove sacrificial material from the long channel nanosheet stacks after most or all sacrificial material has already been removed from the short channel nanosheet stacks. It may be advantageous to selectively oxidize surface portions of source/drain regions adjacent to the short channel nanosheet stacks and then perform a channel release process with selectivity to the oxidized source/drain material, such as during over-etching for removing remaining sacrificial material from the long channel nanosheet stacks. This selective oxidation and subsequent selective channel release may decrease or prevent damage to source/drain regions without negatively affecting the channel release process performance, thereby increasing device yield and device performance. The selective oxidation and subsequent selective channel release may be advantageous by increasing the margin of over-etching for channel release processes, thereby reducing channel release process marginality and improving device yield. The steps of the methods for selective oxidation and subsequent selective channel release are compatible with existing process flows and may be performed in a same chamber (in other words, in situ). The selective oxidation and channel release processes may be performed without plasma.

Embodiments of the disclosure are described in the context of the accompanying drawings. An embodiment of a manufacturing process for a semiconductor structure will be described using FIGS. 2, 3A, 3B, 4A, 4B, 5, 6, 7A, 7B, 8, 9A, 9A, 10A, 10B, 11A, 11B, 12A, 12B, 13A, and 13B. An embodiment related to a relationship between etched amounts of oxidized silicon-germanium (SiGe) versus germanium percentage of the SiGe will be described using FIG. 11C. Experimental results for decrease in etching of oxidized silicon-germanium (SiGe) versus germanium percentage of the SiGe will be described using FIG. 11D. Embodiments of methods for processing substrates will be described using FIGS. 14, 15, and 16. Although this disclosure describes embodiments of selective oxidation of source/drain regions subsequent selective channel release in GAAFET applications, the methods of selective source/drain oxidation and selective channel release may also be applied in various other applications such as stacked FET applications.

FIGS. 2, 3A, 3B, 4A, 4B, 5, 6, 7A, 7B, 8, 9A, 9A, 10A, 10B, 11A, 11B, 12A, 12B, 13A, and 13B illustrate cross-sectional views of a semiconductor device (e.g., a GAAFET device) at intermediate stages of fabrication as an exemplary process flow including a selective oxidation of source/drain regions and subsequent channel release process, in accordance with some embodiments.

Figure 2:
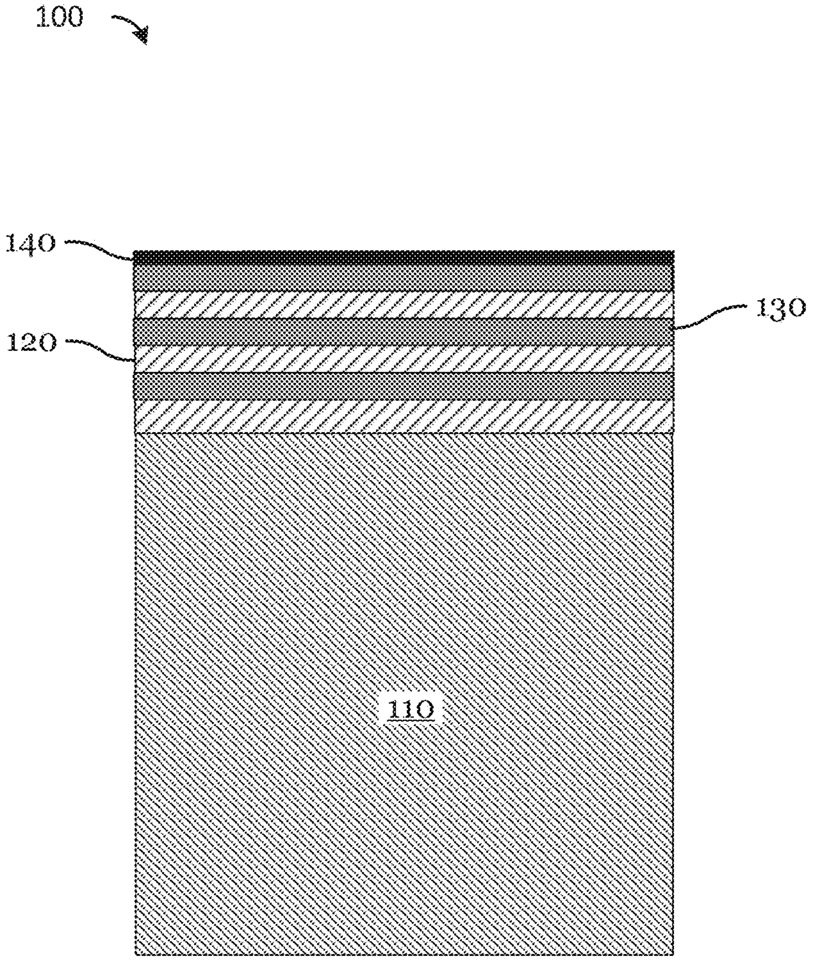
FIGS. 2, 3A, 3B, 4A, 4B, 5, 6, 7A, 7B, 8, 9A, 9B, 10A, 10B, 11A, and 11B illustrate cross-sectional views of intermediate stages of a manufacturing process for a semiconductor structure, in accordance with some embodiments.

FIG. 2 illustrates a cross-sectional view of a semiconductor structure 100 during fabrication. The semiconductor structure 100 may have undergone a number of steps of processing following, for example, a conventional process. As an example, the semiconductor structure 100 comprises a substrate 110 in which various device regions are formed. At this stage, the substrate 110 may include isolation regions such as shallow trench isolation (STI) regions as well as other regions formed therein.

In various embodiments, the substrate 110 comprises a semiconductor substrate. In one or more embodiments, the substrate 110 is a silicon wafer or a silicon-on-insulator (SOI) wafer. In certain embodiments, the substrate 110 comprises a germanium wafer, silicon-germanium wafer, silicon carbide wafer, gallium arsenide wafer, gallium nitride wafer and other compound semiconductors. In other embodiments, the substrate 110 comprises heterogeneous layers such as silicon-germanium on silicon, gallium nitride on silicon, silicon carbon on silicon, as well layers of silicon on a silicon or SOI substrate.

As further illustrated in FIG. 2, a plurality of nanosheets 130 (also referred to as nanosheet layers) are formed over the substrate 110. Specifically, the nanosheets 130 are embedded in a different material. The nanosheets 130 may be spaced apart from each other by one of a plurality of sacrificial layers 120. Thus, a layer stack comprising alternating layers of the sacrificial layers 120 and the nanosheets 130 is over the substrate 110. It should be noted that while three layers of the nanosheets 130 are depicted in FIG. 2, the number of layers is not limited. In various embodiments, at the end of fabrication the nanosheets 130 form channels of a transistor device, while the sacrificial layers 120 will be removed in a later step of fabrication to free up a void space for the formation of a gate dielectric and gate electrode. In various embodiments, the nanosheets 130 have respective thicknesses of a few nanometers to tens of nanometers. For example, in one embodiment the nanosheets 130 have respective thicknesses in a range of 1 nm to 20 nm. In another embodiment, the nanosheets 130 have respective thicknesses in a range of 1 nm to 10 nm. However, the nanosheets 130 may have any suitable thicknesses.

In various embodiments, the sacrificial layers 120 comprise silicon-germanium (SiGe) and the nanosheets 130 comprise silicon (e.g., crystalline silicon). In other embodiments, the sacrificial layers 120 comprise silicon and the nanosheets 130 comprise silicon-germanium. For example, n-type field effect transistors and p-type field effect transistors may be formed with different types of materials. n-FETs may be fabricated with using nanosheets 130 having high electron mobility while p-FETs may be fabricated with using nanosheets 130 having high hole mobility. In certain embodiments, the nanosheets 130 are selected to be a material selected from Groups III-V of the periodic table and the sacrificial layer 120 is selected to be a material from groups II-VI or group IV of the periodic table. In one or more embodiments, the sacrificial layer 120 comprises silicon-germanium with a ratio of $Si_{1-x}Ge_x$ where x is less than 0.25.

In some embodiments, a layer stack of the nanosheets 130 and the sacrificial layer 120 is formed by deposition processes, for example, epitaxially by a chemical vapor deposition (CVD) method. In various embodiments, each layer of the sacrificial layers 120 and the nanosheets 130 may be a few to several nanometers in thickness. In one embodiment, each layer of the sacrificial layers 120 has a thickness in a range of 5 nm and 20 nm and each layer of the nanosheets 130 has a thickness in a range of 1 nm and 10 nm. However, the sacrificial layers 120 and the nanosheets 130 may have any suitable thicknesses.

As further illustrated in FIG. 2, in some embodiments a dielectric blocking layer 140 is over the alternating layer stack of the nanosheets 130 and the sacrificial layer 120. In various embodiments, the dielectric blocking layer 140 is an oxide layer. The dielectric blocking layer 140 may be formed by one or more suitable deposition processes, such as by a CVD method. The dielectric blocking layer 140 may be used as an etch stop layer, such as for a dummy gate removal process, and may be optional.

Figure 3A:
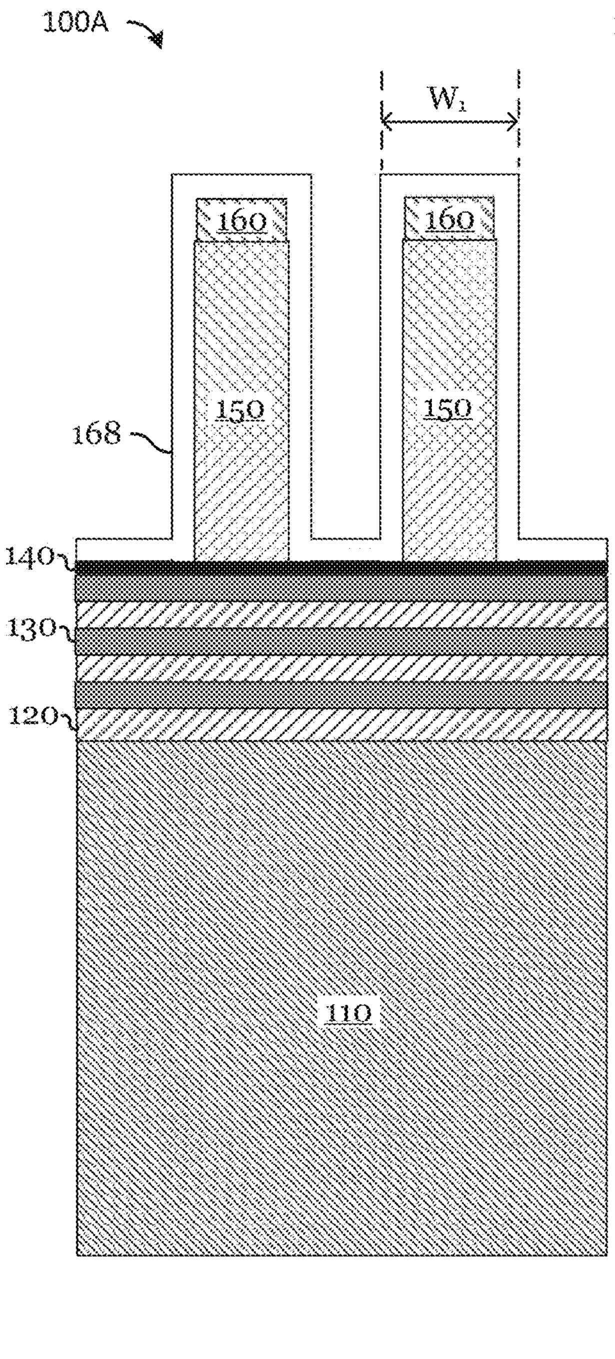
Figure 3B:
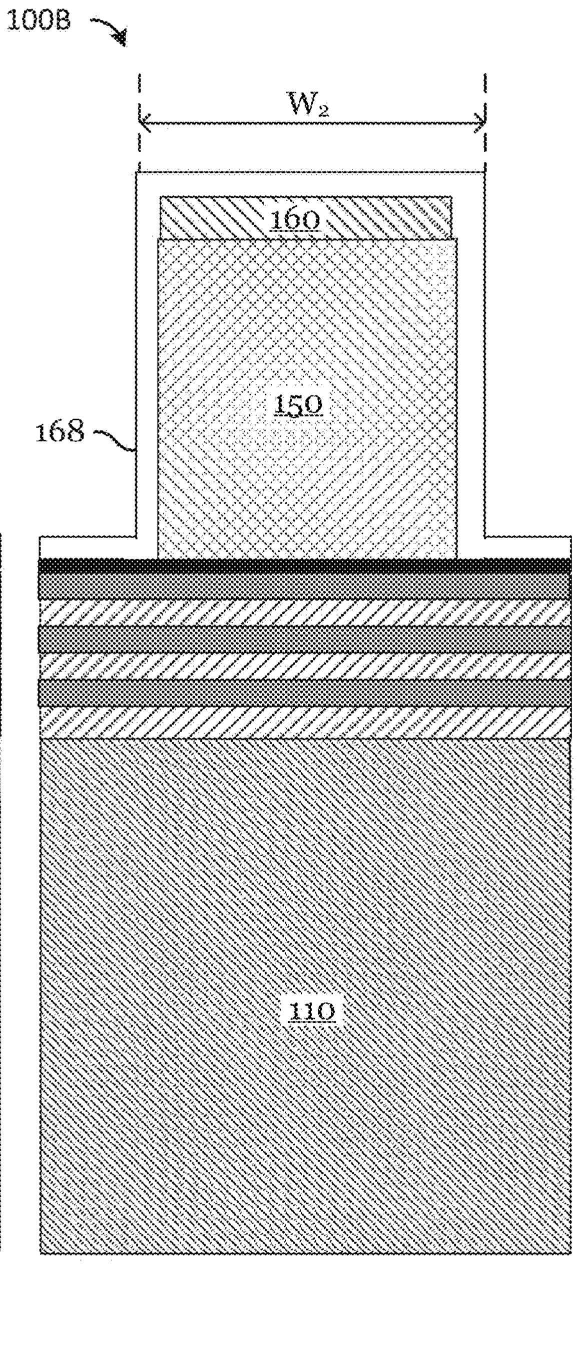

FIGS. 3A and 3B, following from FIG. 2, illustrate cross-sectional views of the semiconductor structure 100 after forming dummy gate structures over the layer stack. FIG. 3A illustrates a short channel region 100A of the semiconductor structure 100 that may be used for the formation of short channel devices (e.g., short channel GAAFETs or the like), and FIG. 3B illustrates a long channel region 100B of the semiconductor structure 100 that may be used for the formation of long channel devices (e.g., long channel GAAFETs or the like).

In various embodiments, a dummy stack comprising a dummy material is formed over the stack of the nanosheets 130 and the sacrificial layer 120 in the short channel region 100A and the long channel region 100B. The dummy stack is patterned to form dummy gates 150. FIG. 3A illustrates a feature of two fins for dummy gates 150 and FIG. 3B illustrates a feature of one fin for a dummy gate 150 as examples. However, any suitable number of dummy gates 150 may be formed for any suitable number of fins. The dummy gates 150 comprise a suitable material such as polysilicon or amorphous silicon. The dummy gates 150 may be deposited using deposition techniques such as vapor deposition including chemical vapor deposition (CVD), physical vapor deposition (PVD), as well as other plasma processes such as plasma enhanced CVD (PECVD), sputtering, the like, or a combination thereof. In some embodiments, the dummy gates 150 have respective thicknesses of 50 nm to 500 nm.

Still referring to FIGS. 3A and 3B, in some embodiments a hard mask layer is formed before the patterning of the dummy gates 150 to form a hard mask 160. In various embodiments, the hard mask 160 comprises silicon oxide (SiO), silicon dioxide ($SiO_2$), silicon nitride (SiN), silicon carbonitride (SiCN), silicon oxycarbide (SiOC), silicon oxynitride (SiON), silicon carbide (SiC), amorphous silicon, polycrystalline silicon, titanium nitride (TiN), the like, or a combination thereof. Further, the hard mask 160 may be a stacked hard mask comprising, for example, two or more layers, each of which is formed with a different material. In an example, the first hard mask of the hard mask 160 comprises a metal-based layer such as titanium nitride (TiN), titanium (Ti), tantalum nitride (TaN), tantalum (Ta), tungsten (W) based compounds, ruthenium (Ru) based compounds, or aluminum (Al) based compounds, and the second hard mask of the hard mask 160 comprises a dielectric layer such as silicon oxide (SiO), silicon dioxide ($SiO_2$), silicon nitride (SiN), silicon carbonitride (SiCN), silicon oxycarbide (SiOC), silicon oxynitride (SiON), silicon carbide (SiC), amorphous silicon, or polycrystalline silicon. The hard mask 160 may be deposited using deposition techniques such as vapor deposition including chemical vapor deposition (CVD), physical vapor deposition (PVD), as well as other plasma processes such as plasma enhanced CVD (PECVD), sputtering, and other processes. In various embodiments, the hard mask 160 has a thickness in a range of 5 nm to 50 nm. In some embodiments, the hard mask 160 is patterned over the layer stack comprising alternating layers of the sacrificial layers 120 and the nanosheets 130, and the dummy gates 150 are not present.

After patterning to form the dummy gate 150 and the hard mask 160, a sidewall spacer layer 168 is deposited over the alternating layer stack of the nanosheets 130 and the sacrificial layer 120. In various embodiments, the optional dielectric blocking layer 140 may be etched prior to depositing the sidewall spacer layer 168. In various embodiments, the sidewall spacer layer 168 comprise a dielectric material comprising an oxide or a nitride. In some embodiments, the sidewall spacer layer 168 comprises silicon-containing dielectric materials such as silicon oxide (SiO), silicon dioxide ($SiO_2$), silicon oxynitride (SiON), silicon oxycarbonitride (SiOCN), silicon boron carbonitide (SiBCN), the like, or a combination thereof. The sidewall spacer layer 168 may be deposited using deposition techniques such as vapor deposition including chemical vapor deposition (CVD), physical vapor deposition (PVD), as well as other plasma processes such as plasma enhanced CVD (PECVD), atomic layer deposition (ALD), sputtering, and other processes. In various embodiments, the sidewall spacer layer 168 has a thickness in a range of 1 nm to 10 nm. In certain embodiments, the sidewall spacer layer 168 is a stacked layer comprising, for example, two or more layers using two different materials.

In some embodiments, the dummy gate structures (including dummy gates 150 and sidewall spacer layer 168) in the short channel region 100A have respective widths $W_1$ in a range of 10 nm to 50 nm, and the dummy gate features in the long channel region 100B have respective widths $W_2$ in a range of 80 nm to 120 nm. These widths correspond to channel widths (e.g., widths of the nanosheets 130, which may be used to form channels in GAAFET devices or the like) and be advantageous for subsequent formation of devices with short channel widths and long channel widths.

Figure 4A:
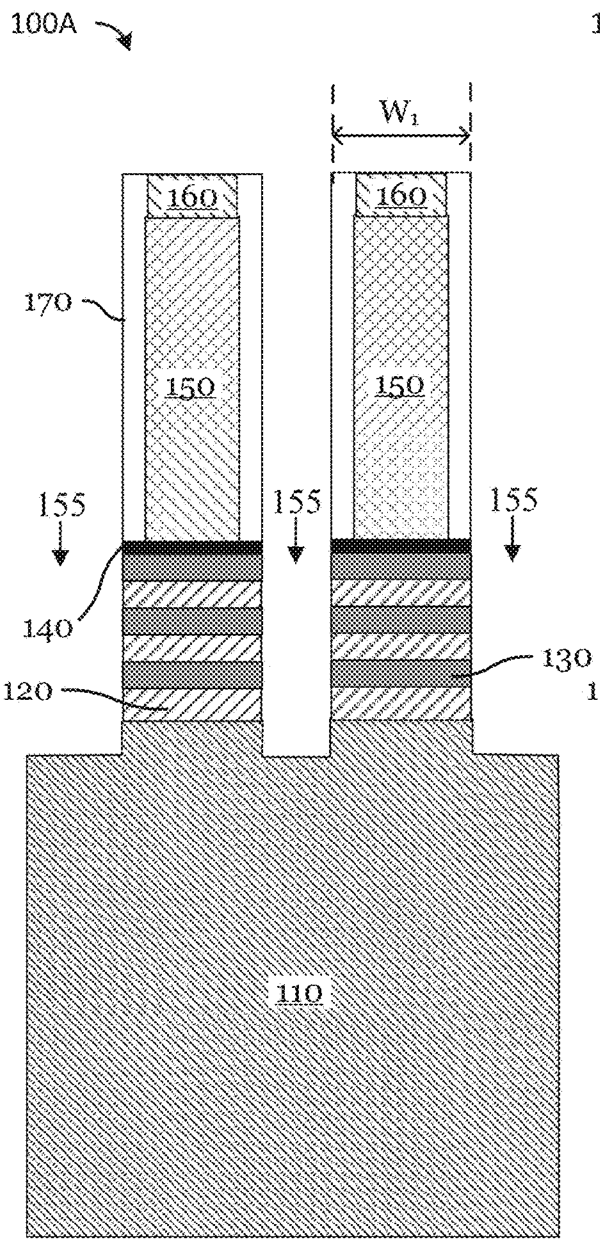
Figure 4B:
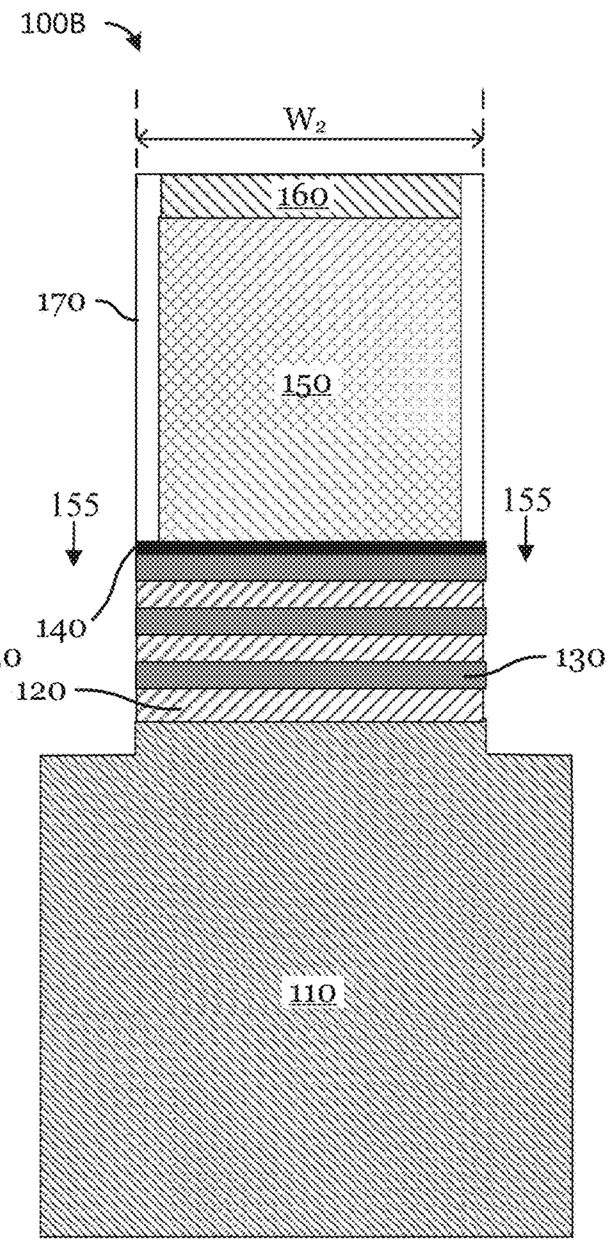

FIGS. 4A and 4B, following from FIGS. 3A and 3B, respectively, illustrate the semiconductor structure 100 in the short channel region 100A and the long channel region 100B, respectively, after anisotropically etching the sidewall spacer layer 168, the alternating layer stack of nanosheets 130 and sacrificial layer 120, and the substrate 110 to form a plurality of vertical recesses 155. An anisotropic etch removes the lateral portions of the sidewall spacer layer 168 so that vertical portions of the sidewall spacer layer 168 remain as sidewall spacers 170 on the sidewalls of the dummy gate 150 and the hard mask 160.

Next, a source/drain fin etch back process may be performed to anisotropically remove portions of the dielectric blocking layer 140 and the alternating layer stack of the nanosheets 130 and the sacrificial layer 120, thereby forming fin features (primarily the channel regions of the transistors) under the dummy gate structures separated by the plurality of vertical recesses 155. In various embodiments, these etch back processes may be performed as a single etch process or alternately as two or more etch processes. In certain embodiments, these etch back process may comprise one or more wet etch processes, plasma etch processes such as reactive ion etch (RIE) processes, or combinations of these or other etch processes. Sidewalls of the nanosheets 130 and the sacrificial layer 120 are exposed by the formation of the vertical recesses 155. In various embodiments, nanosheets 130 of the layer stack in the short channel region 100A have smaller widths than nanosheets 130 of the layer stack in the long channel region 100B.

FIGS. 5, 6, 7A, 7B, and 8 follow from FIG. 3A and illustrate cross-sectional views of intermediate stages of manufacturing for the semiconductor structure 100 performed in the short channel region 100A. It should be understood that analogous intermediate stages of manufacturing are also performed on the semiconductor structure 100 in the long channel region 100B.

Figure 5:
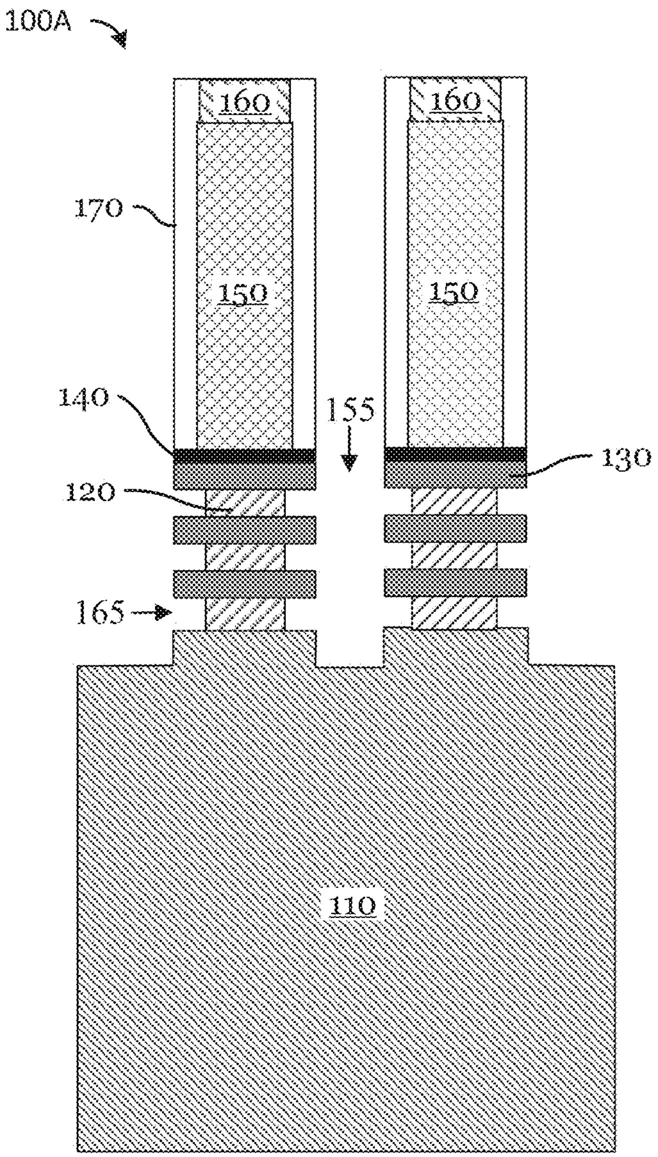

In FIG. 5, a lateral recess etch (cavity etch) is performed on the semiconductor structure 100 to selectively remove a portion of the sacrificial layers 120 relative to the nanosheets 130. In other words, the sacrificial layers 120 are laterally recessed (or etched) to form a plurality of lateral recesses 165 (also referred to as indents) between layers of the nanosheets 130. Although the recession of the sacrificial layers 120 may be described as lateral relative to the nanosheets 130, it may be performed by a uniform (in other words, isotropic) recession or etching of the sacrificial layers 120. In various embodiments, the lateral recess etch process comprises one or more isotropic etching process, such as one or more wet etch processes. In other embodiments, the lateral recess etch process includes plasma etch processes such as atomic layer etching processes as well as reactive ion etch (RIE) processes or combinations of these or other etch processes.

Figure 6:
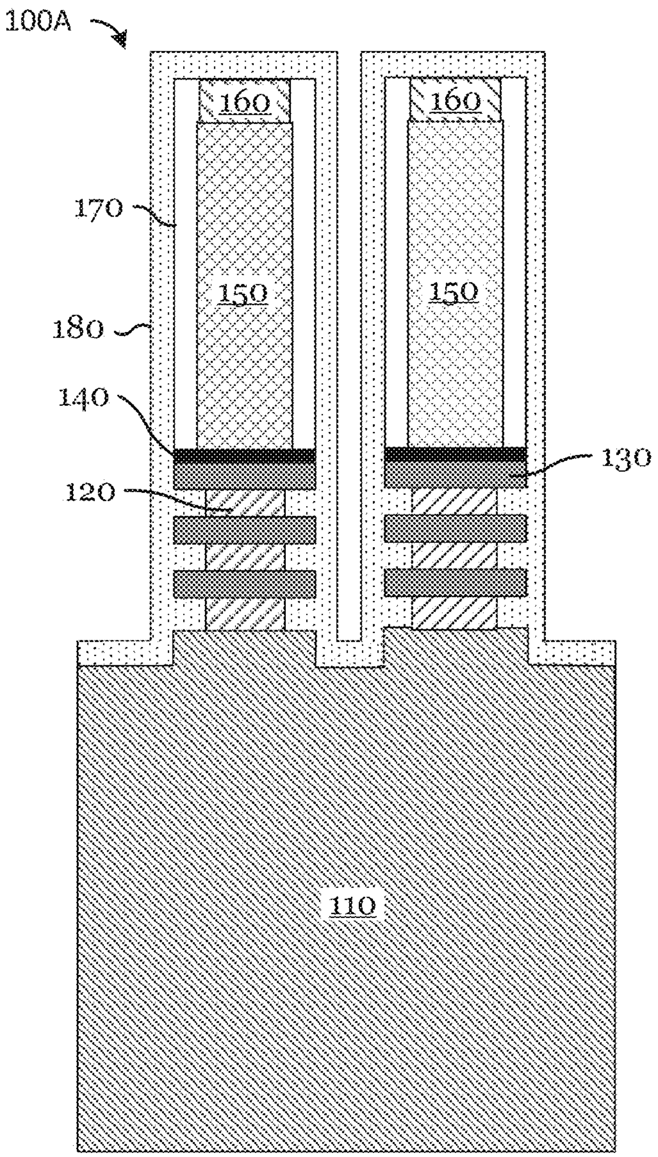

In FIG. 6, following from FIG. 5, an inner spacer layer 180 is deposited over the semiconductor structure 100. In this step, the lateral recesses 165 (see above, FIG. 5) are also filled with the material of the inner spacer layer 180. The material of the inner spacer layer 180 may be made porous to reduce its dielectric constant in order to minimize the parasitic capacitance caused by the subsequently formed inner spacers (see below, FIGS. 7A-7B) and thus the material of the inner spacer layer 180 may be a low-k dielectric material.

In some embodiments, the inner spacer layer 180 comprises silicon-containing dielectric materials such as silicon nitride (SiN), silicon carbonitride (SiCN), silicon oxycarbonitride (SiOCN or SiOCNH), silicon boron carbonitride (SiBCN), the like, or a combination thereof. In one embodiment, the inner spacer layer 180 is a low-k dielectric material comprising SiOCNH with additional ionic bonds (e.g., carbon-hydrogen bonds) and fewer polar bonds than other silicon-containing dielectric materials, which may produce some porosity that may reduce its k value. The formation of the inner spacer layer 180 may be performed by deposition from a gas phase using, for example, chemical vapor deposition (CVD), plasma-enhanced CVD (PECVD), low-pressure CVD (LPCVD), physical vapor deposition (PVD), atomic layer deposition (ALD), other deposition processes, the like, or a combination thereof. For a plasma deposition process, a precursor gas mixture can be used including but not limited to silanes, hydrocarbons, fluorocarbons, or nitrogen containing compounds in combination with one or more dilution gases (e.g., argon, nitrogen, etc.) at a variety of pressure, power, flow and temperature conditions.

Figure 7A:
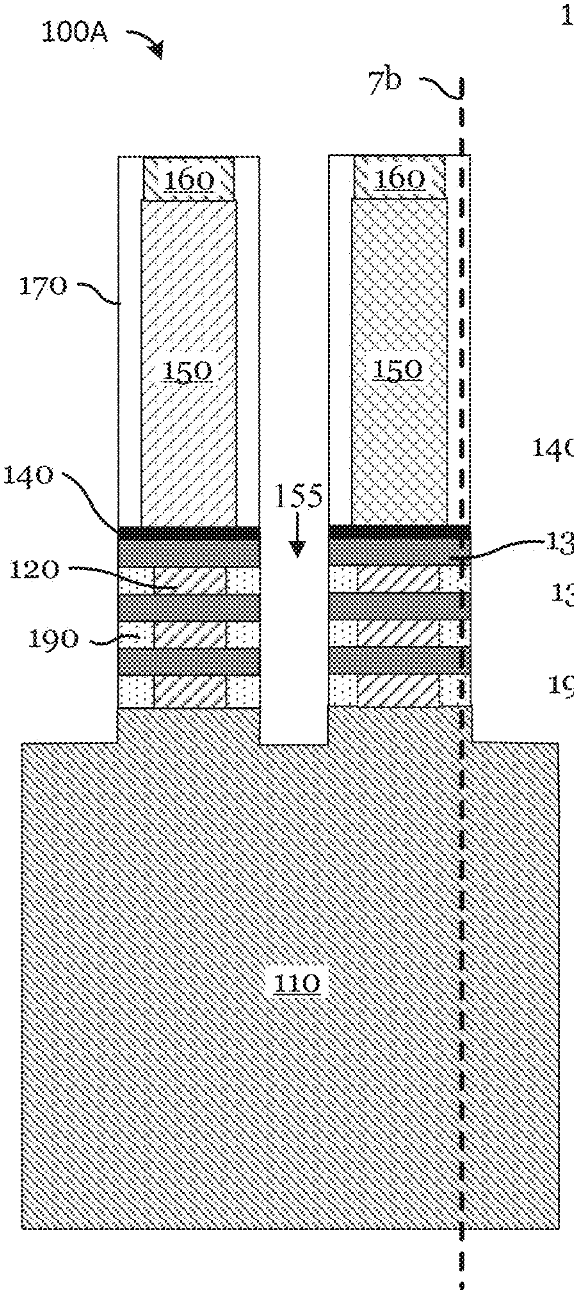
Figure 7B:
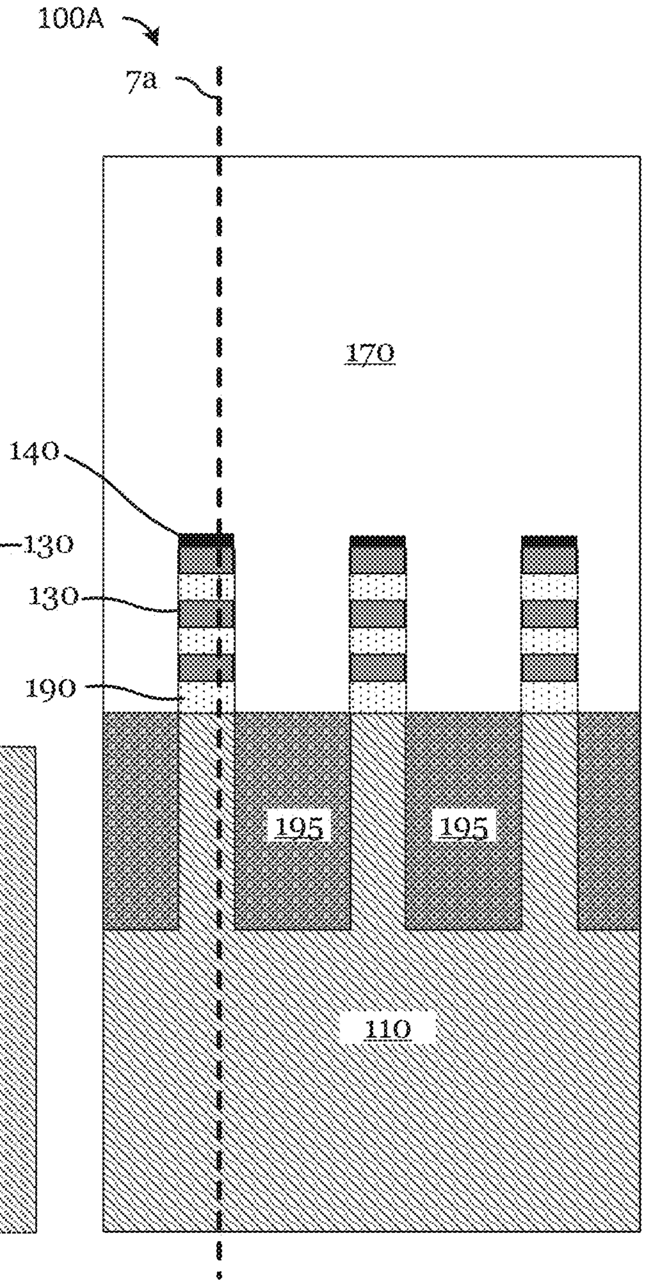

Next, in FIGS. 7A and 7B, an inner spacer etch back is performed on the semiconductor structure 100 to form inner spacers 190. FIG. 7A illustrates a same cross-sectional view of the semiconductor structure 100 following from FIG. 6, and FIG. 7B illustrates another cross-sectional view of the semiconductor structure 100 perpendicular to the cross-sectional view of FIG. 7A. The inner spacer etch back removes a portion of the inner spacer layer 180 (see above, FIG. 6) to expose tips of the nanosheets 130. The inner spacer etch back may remove the portions of the inner spacer layer 180 over the hard mask 160, the sidewall spacers 170, and the substrate 110. Some portions of the inner spacer layer 180 are left between the layers of nanosheets 130 to form inner spacers 190. These remaining portions may provide electrical insulation between the gate region and source/drain region that will be formed at later steps in fabrication.

In various embodiments, the inner spacer etch back process comprises one or more wet etch processes, plasma etch processes, reactive ion etch (RIE) processes, or combinations of these or other etch processes. In one or more embodiments, the sidewall spacer etch back process comprises an anisotropic etching process, for example, a RIE processes followed optionally by a short isotropic etching process to expose the layers of nanosheets 130.

FIG. 7B illustrates another cross-sectional view of the semiconductor structure 100 along a cross section indicated by the dashed line 7*b* in FIG. 7A. Conversely, FIG. 7A illustrates the cross-sectional view of the semiconductor structure 100 along a cross section indicated by the dashed line 7a in FIG. 7B. In FIG. 7B, isolation regions such as shallow trench isolation (STI) regions 195 are visible, which may also be present in all of the previous embodiment illustrations (FIGS. 2, 3A, 3B, 4A, 4B, 5, and 6). In various embodiments, the STI regions 195 comprise an oxide such as silicon oxide (SiO) or silicon dioxide ($SiO_2$). The STI regions 195 serve to electrically isolate adjacent electronic components. With a completion of the inner spacer formation, the tips of the nanosheets 130, the dielectric blocking layer 140, and the inner spacers 190 are exposed and visible in the plurality of vertical recesses 155. However, the sacrificial layers 120 are masked by the inner spacers 190. Further, in FIG. 7B, the dummy gate 150 visible in FIG. 7A is masked by the sidewall spacer 170. The sidewall spacer 170 is visible after a completion of removing portions of the inner spacer layer 180 (see above, FIG. 6).

Figure 8:
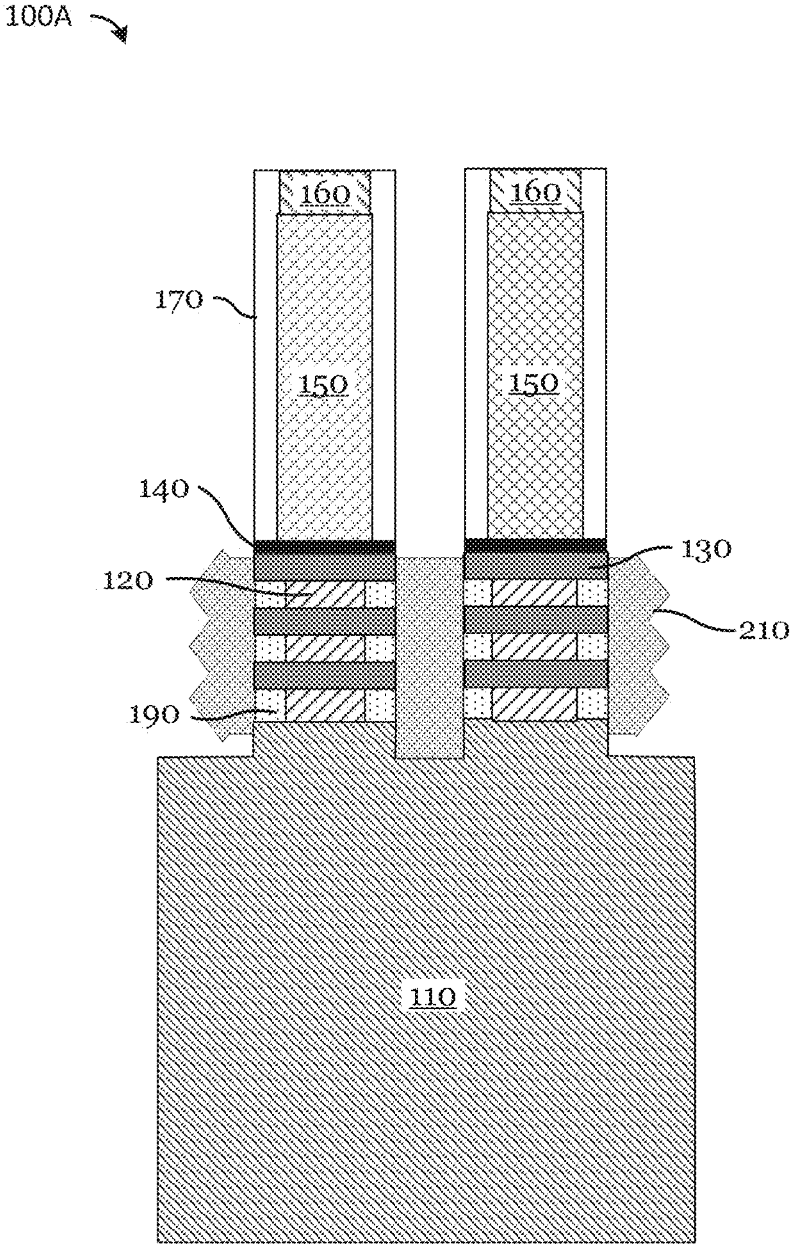

FIG. 8, following from FIG. 7A and illustrating the same cross-sectional view, illustrates a cross-sectional view of the semiconductor structure 100 in the short channel region 100A after source/drain region formation. In various embodiments, source/drain regions 210 are formed with a source/drain material. The source/drain material fills the plurality of vertical recesses 155 (see above, FIG. 7A) and covers the exposed tips of the nanosheets 130. Any remaining unfilled portions of the lateral recesses 165 (see above, FIG. 5) may also be filled by the source/drain material. The formation of the source/drain regions 210 may be performed, for example, by epitaxial growth. In certain embodiments, the source/drain regions 210 formed with an epitaxial growth process comprise a faceted outer surface. In various embodiments, the semiconductor structure 100 is used to fabricate a pFET, and accordingly the source/drain material comprises a p-type semiconductor, for example, silicon-germanium (SiGe). In various embodiments, the Ge concentration in the source/drain material is higher than that in the sacrificial layer 120. In one or more embodiments, the SiGe for the source/drain material has a ratio of $Si_{1-x}Ge_x$ where x is greater than 0.5. In other words, the Ge concentration of the SiGe in the source/drain regions 210 is 50% or greater, such as 50% to 70%. However, any suitable concentration of germanium may be used. The SiGe of the source/drain regions 210 may be further doped, such as with boron. In certain embodiments, the dopant concentration in the source/drain regions 210 is in a range of $1\times10^{20}/cm^3$ to $5\times10^{20}/cm^3$.

In certain embodiments, although not specifically illustrated, the semiconductor structure 100 further comprises one or more nFET structures adjacent to the pFET structures illustrated in FIGS. 2, 3A, 3B, 4A, 4B, 5, 6, 7A, and 7B. For the nFET structures, the semiconductor structure 100 may comprise a similar fin and dummy gate structure where a n-semiconductor (e.g., phosphorous-doped silicon) may be epitaxially grown from the tips of the nanosheets.

Figure 9A:
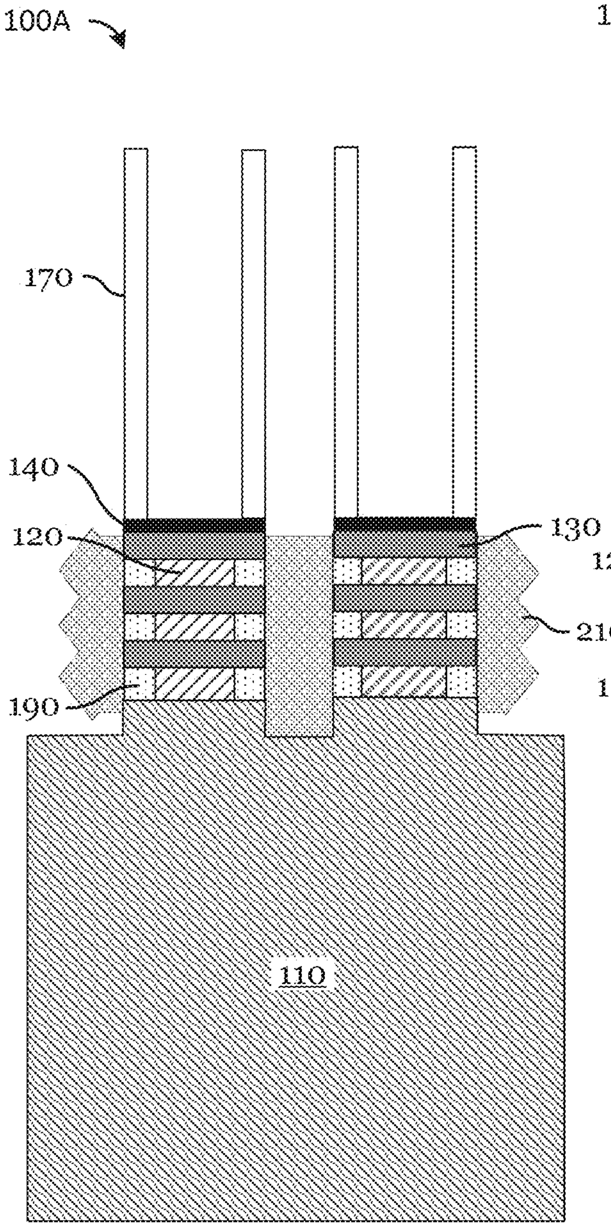
Figure 9B:
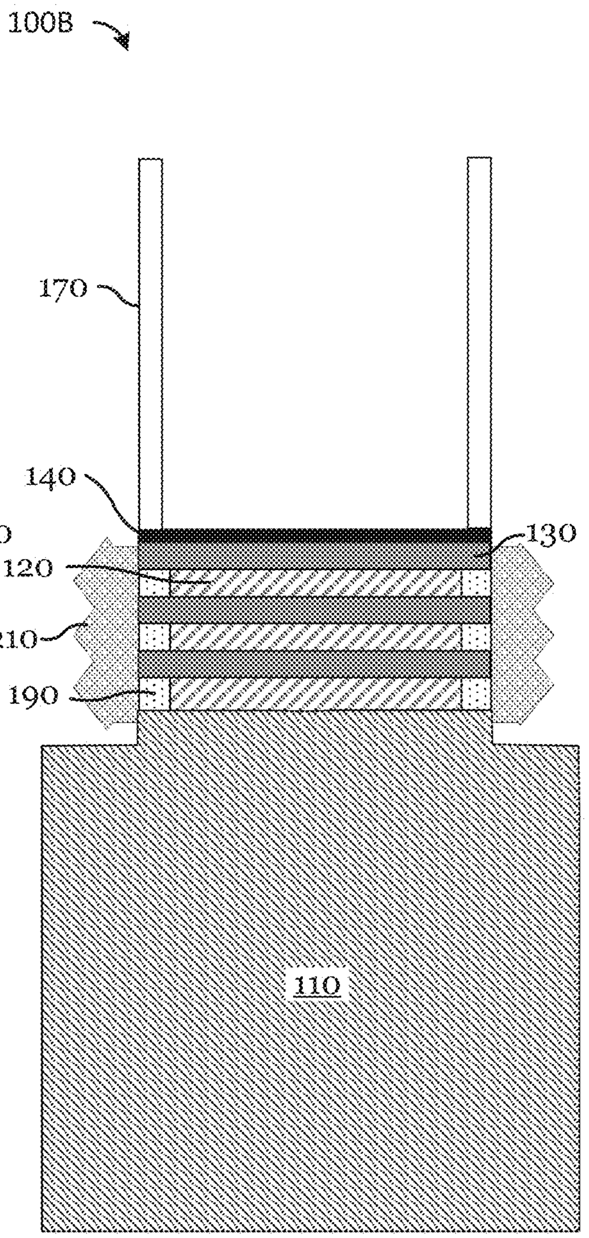
Figure 10A:
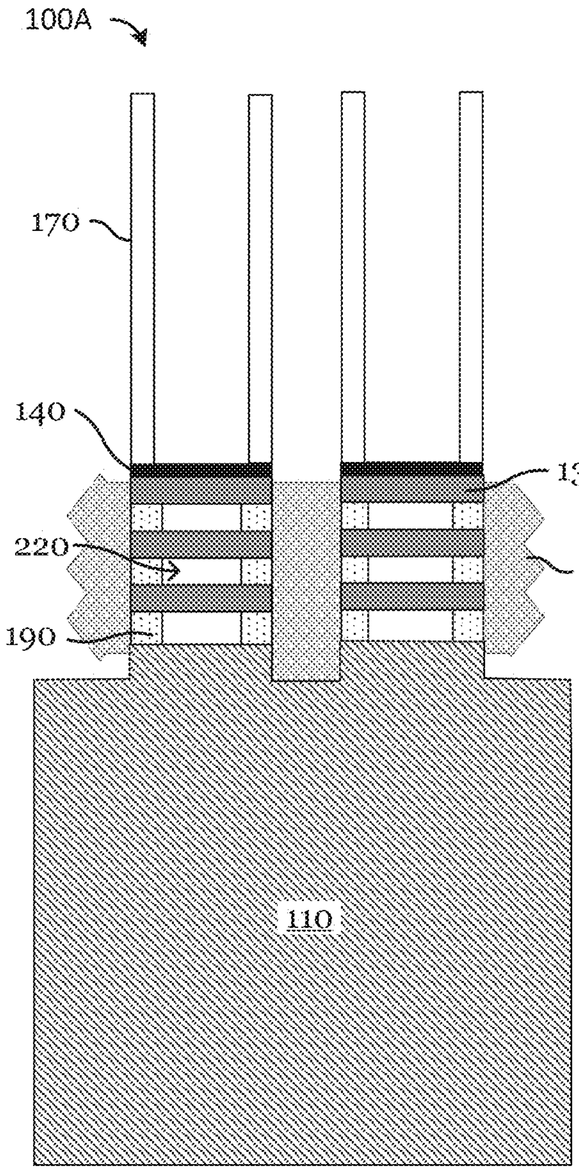
Figure 10B:
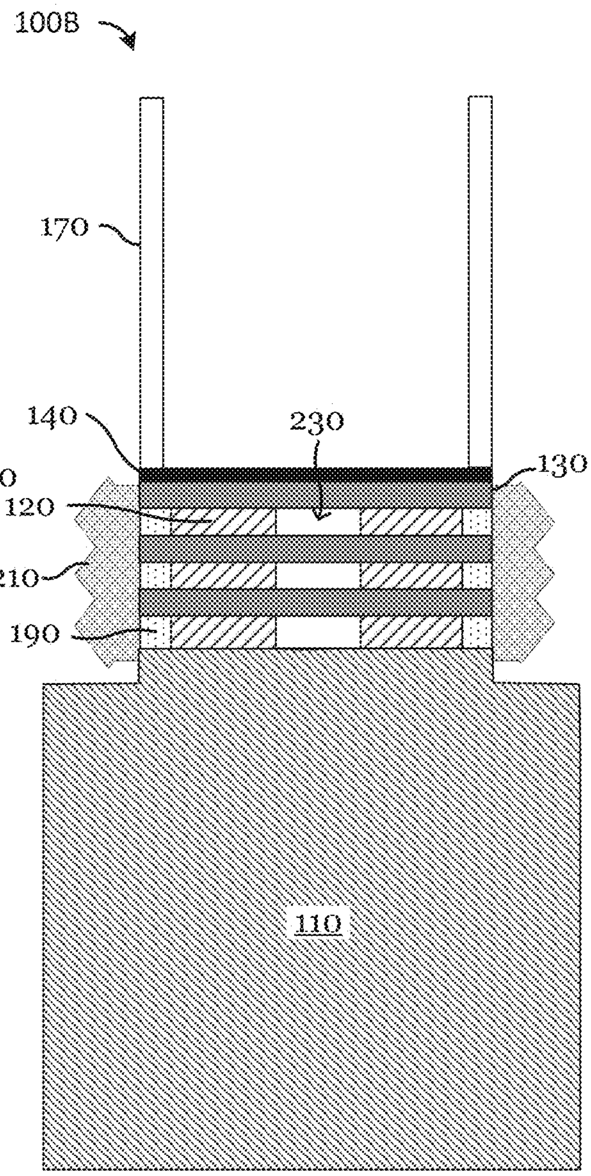

Next, FIGS. 9A and 9B illustrate cross-sectional views of the semiconductor structure 100 in the in the short channel region 100A and the long channel region 100B, respectively, after a dummy gate removal. FIG. 9A follows from FIG. 8 and FIG. 9B follows from FIG. 4B after the same process steps are performed as described above with respect to FIGS. 5-6, 7A, and 8. After the formation of the source/drain regions 210, the remaining portion of the hard mask 160 and the dummy gates 150 are removed, such as with a dummy gate pull process. In certain embodiments, the dummy gate pull process is performed using a plasma etch process such as a reactive ion etch (RIE) process or the like.

In some embodiments, after the dummy gate pull and prior to a subsequent step of channel release (see below, FIG. 10A), an oxide removal process is performed to remove a surface oxide layer that may be present over the sacrificial layers 120. For example, the oxide removal process may be a plasma-less process comprising exposing the semiconductor structure 100 to a process gas (such as a gas comprising, for example, hydrogen fluoride (HF)) in the absence of plasma. In an embodiment, the process gas comprises about 30% HF and 30% $NH_3$ in a carrier gas (e.g., argon (Ar)) and the process temperature is in a range of 35° C. to 80° C. The oxide removal process may be followed by a thermal treatment comprising heating the semiconductor structure 100 to a temperature in a range of 100° C. to 200° C. under an inert gas flow (such as an argon (Ar) flow).

FIGS. 10A, 10B, 11A, 11B, 11C, 11D, 12A, and 12B illustrate a method for channel release including selective oxidation of portions of source/drain regions 210 and a subsequent channel release selective to the oxidized portions of the source/drain regions. This may be advantageous by decreasing or preventing damage to the source/drain regions 210 without negatively affecting the channel release process performance, which can increase device yield and device performance. The selective oxidation and subsequent selective channel release may increase the margin of over-etching for channel release processes (such as processes including both short channels and long channels that may benefit from over-etching), which may reduce channel release process marginality and improve device yield. In various embodiments, the process steps described below with reference to 10A, 10B, 11A, 11B, 11C, 11D, 12A, and 12B are performed in a single process chamber (e.g., a vacuum chamber) and may be performed in situ. In some embodiments, the selective oxidation and channel release processes are plasma-free; in other words, the steps are performed without generation and/or use of plasma. Although embodiments of the selective oxidation and channel release are described using a semiconductor having short channel and long channel regions as an example, the selective oxidation and channel release methods may be used for the manufacturing suitable application (e.g., GAAFET, CFET, or the like) with or without short and/or long channel regions, and all such applications are within the scope of the disclosed embodiments.

Following from FIGS. 9A and 9B, FIGS. 10A and 10B illustrate cross-sectional views of the semiconductor structure 100 in the short channel region 100A and the long channel region 100B, respectively, after a first channel release process. In various embodiments, the first channel release process removes most or all of the sacrificial material from the sacrificial layers 120 in the short channel region 100A, and the first channel release process removes portions of the sacrificial material from the sacrificial layers 120 in the long channel region 100B. This removal of the sacrificial layers 120 in the short channel region 100A forms voids 220 between the nanosheets 130 and inner spacers 190, and the removal of portions of the sacrificial layers 120 in the long channel region 100B forms voids 230 between the nanosheets 130 and remaining portions of the sacrificial layers 120. Although FIG. 9B illustrates the voids 230 as a respective single void 230 being in the middle of each of the sacrificial layers 120, any number of voids 230 may be formed with any sizes and positions between the nanosheets 130 and inner spacers 190.

In some embodiments, the first channel release process is a plasma-less etch process that is a two-step process comprising a fluorocarbon pretreatment step and an etch step.

Both steps may be advantageously performed in the absence of plasma. The fluorocarbon pretreatment comprises exposing the semiconductor structure 100 to a pretreatment gas comprising a fluorocarbon that may selectively passivate the material of the source/drain regions 210 (e.g., B-doped SiGe), and the etch step comprises exposing the semiconductor structure 100 to an etch gas comprising fluorine to etch the sacrificial layers 120 selectively, without causing damage to the source/drain regions 210. In various embodiments, the fluorocarbon for the pretreatment gas comprises $C_2F_6$, $C_4F_8$, or a compound with a general chemical formula $C_xF_y$. In another embodiment, the fluorocarbon further comprises hydrogen (i.e., hydrofluorocarbon with a general chemical formula $C_xH_yF_z$). However, any suitable protection method may be used to protect exposed surfaces of the source/drain regions 210 prior to removing the sacrificial layers 120 with an etch step.

In various embodiments, the etch step of the first channel release process is performed with an etch gas comprising fluorine. In one or more embodiments, the etch step is performed at a chamber pressure in a range of 10 mTorr to 500 mTorr, at a substrate temperature in a range of 0° C. to 55° C., and/or with a process gas comprising hydrogen fluoride (HF), fluorine ($F_2$), chlorine trifluoride ($ClF_3$), argon (Ar), nitrogen ($N_2$), the like, or a combination thereof. In one embodiment, the process time is in a range of 10 seconds to 300 seconds. In one embodiment, the etch step is performed without exposing the semiconductor structure 100 to the fluorocarbon of the pretreatment gas or any other fluorocarbon. In another embodiment, the etch gas further comprises a fluorocarbon. In other embodiments, the fluorocarbon treatment is integrated into the etch step and the plasma-less etch process is performed as a single continuous process.

In some embodiments, after the first channel release process is complete, a post-etch thermal treatment is performed. This may be advantageous by removing etch byproducts and providing a clean process environment for subsequent processes, such as a selective oxidation and second channel release process (see below, FIGS. 11A-11B and 12A-12B). In various embodiments, the post-etch thermal treatment heats the semiconductor structure 100 to a temperature in a range of 100° C. to 200° C., at a chamber pressure in a range of 1000 mTorr to 5000 mTorr, and under a gas flow comprising argon (Ar), nitrogen ($N_2$), the like, or a combination thereof.

Figure 11A:
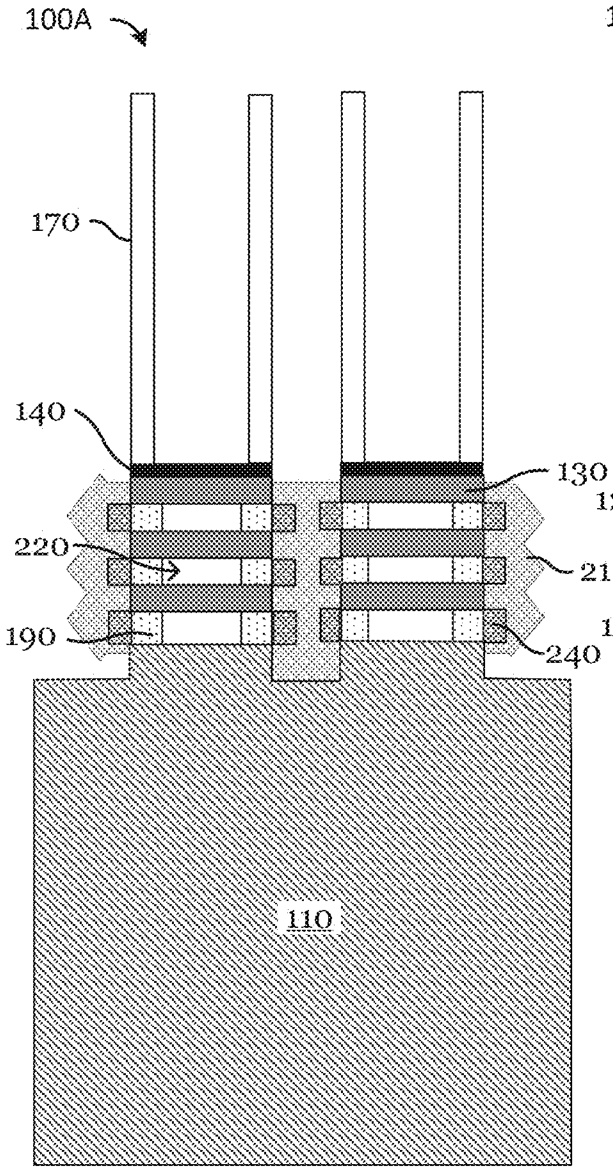
Figure 11B:
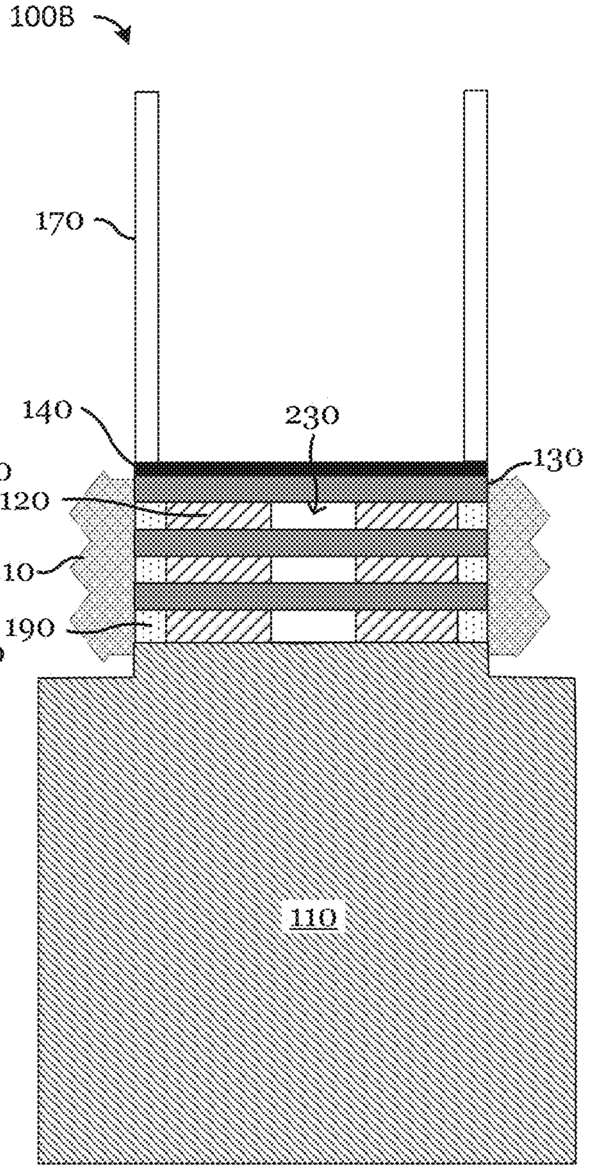

Next, FIGS. 11A and 11B illustrate cross-sectional views of the semiconductor structure 100 in the short channel region 100A and the long channel region 100B, respectively, after a selective oxidation is performed on the source/drain regions 210. The selective oxidation is used to oxidize portions (also referred to as surface layers) of the source/drain regions 210 adjacent to the inner spacers in the short channel region 100A, thereby forming oxidized regions 240. Due to their oxidation, the oxidized regions 240 may enable greater selectivity of a subsequent second channel release process (see below, FIGS. 12A-12B) so that it removes remaining portions of the sacrificial layers 120 in the long channel region 100B while reducing or preventing damage to the source/drain regions 210 in the short channel region 100A.

The selective oxidation may be performed at a chamber pressure in a range of 5 Torr to 90 mTorr, at a substrate temperature in a range of 25° C. to 300° C., and/or with a process gas comprising nitric oxide (NO), argon (Ar), nitrogen ($N_2$), the like, or a combination thereof. In some embodiments, the selective oxidation is performed at a chamber pressure in a range of 5 Torr to 50 mTorr, at a substrate temperature in a range of 25° C. to 100° C., and with a process gas comprising 75% nitric oxide (NO) with argon (Ar) and nitrogen ($N_2$). In one embodiment, the oxidation process time is in a range of 10 seconds to 300 seconds. Pressure and temperature may be tuned to produce a desired amount of oxidation for increasing selectivity of a subsequent etch process. The nitric oxide may enter the voids 220 and penetrate through the inner spacers 190 to oxidize portions of the source/drain regions 210 immediately adjacent to the inner spacers 190, thereby forming oxidized regions 240. Subsequently, these oxidized regions 240 may act as effective barriers to etchants during a second channel release process (see below, FIGS. 12A-12B). The oxidation process is selective to the material of the source/drain regions 210 over the remaining material of the sacrificial layer 120. This may be due to the greater ratio of germanium to silicon in the source/drain regions 210 (e.g., 55% or more Ge) compared with the sacrificial layer 120 (e.g., 25% or less Ge).

Figure 11C:
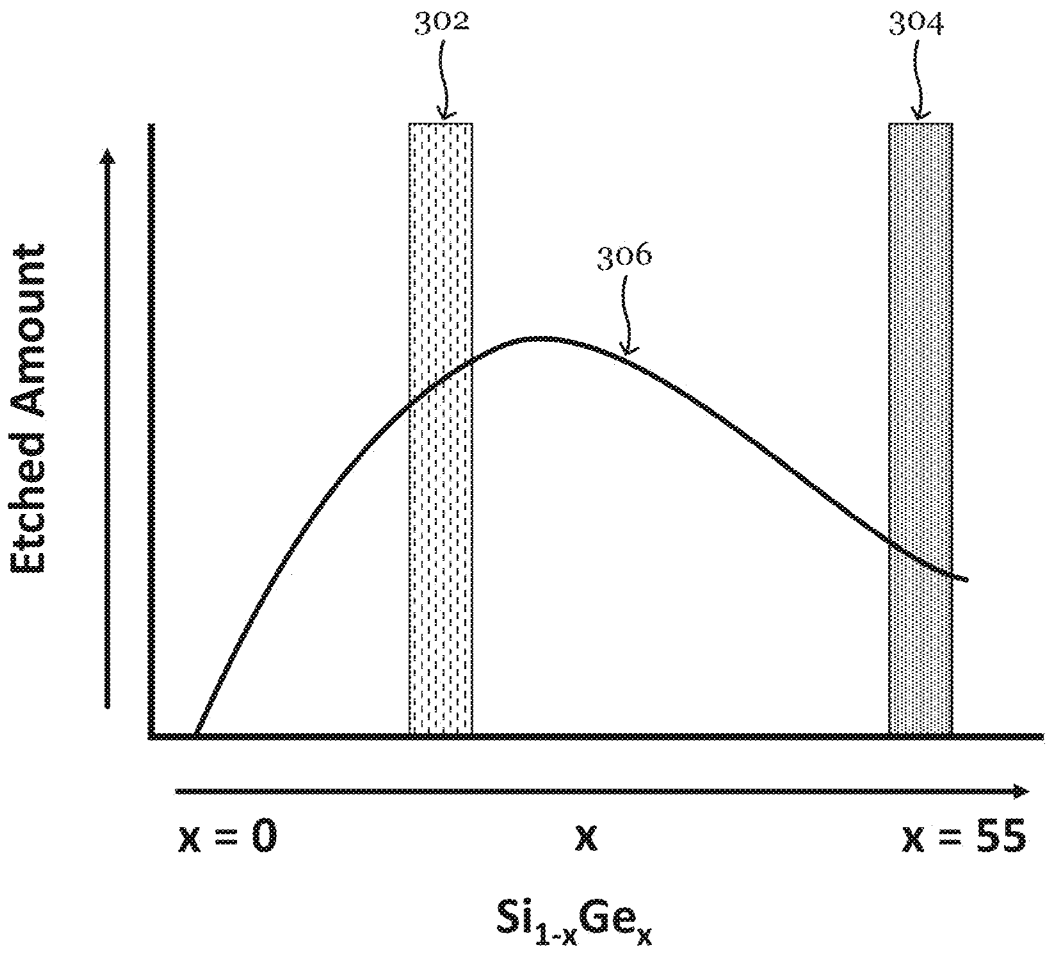
FIG. 11C illustrates a graph of etched amounts of oxidized silicon-germanium (SiGe) versus germanium percentage of the SiGe, in accordance with some embodiments.

FIG. 11C illustrates a graph of etched amount of silicon-germanium (SiGe) that has been oxidized before etching versus germanium percentage of the SiGe. Line 306 shows the relative change in etched amount of SiGe for an etch process after a selective oxidation process applied to SiGe with varying percentages of Si and Ge. Bar 302 represents SiGe with Ge percentage of 25% or less (e.g., SiGe in the sacrificial layer 120) and bar 304 represents SiGe with Ge percentage of 55% or greater (e.g., SiGe in the source/drain regions 210). As such, the selective oxidation process of line 306 may produce greater oxidation in the SiGe of the source/drain regions 210 compared with the SiGe of the sacrificial layer 120. This may lead to enhancement of the selectivity of a subsequent etch to the less oxidized sacrificial layer 120 SiGe (bar 302) compared with the more oxidized SiGe in the source/drain regions 210 (bar 304, corresponding to the oxidized regions 240; see above, FIG. 11A).

Figure 11D:
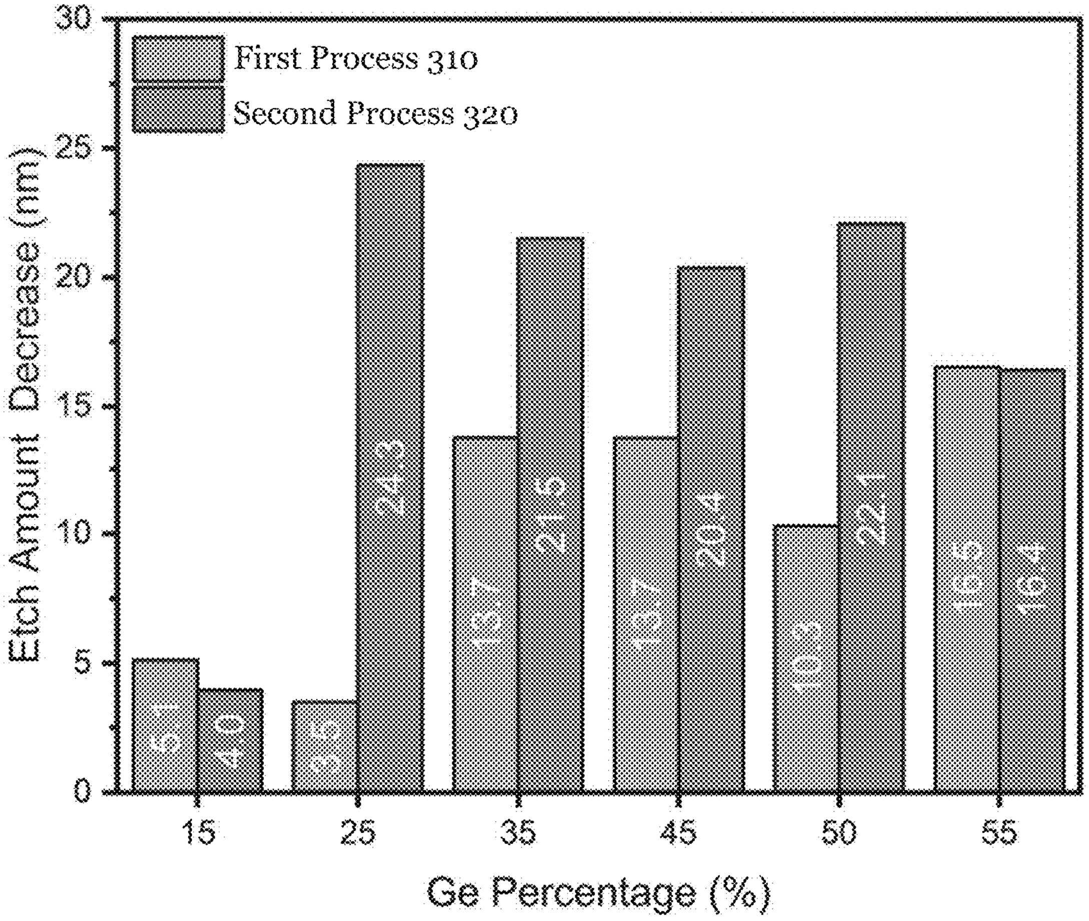
FIG. 11D illustrates experimental results for decrease in etching of oxidized silicon-germanium (SiGe) versus germanium percentage of the SiGe, in accordance with some embodiments.
Figure 12A:
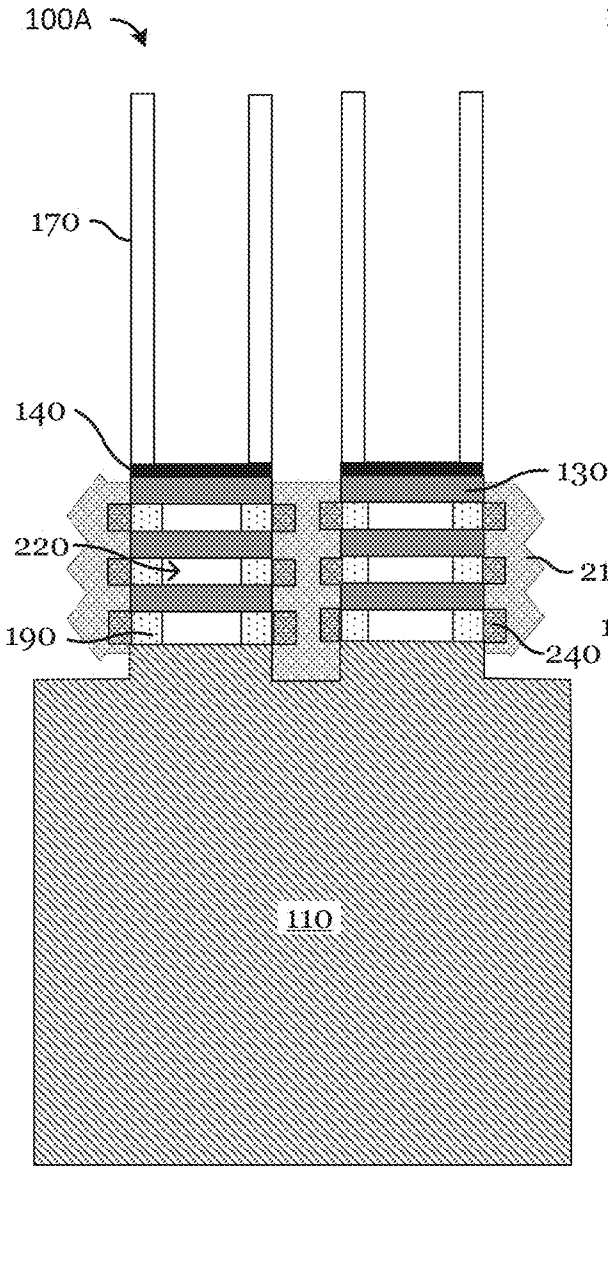
FIGS. 12A, 12B, 13A, and 13B illustrates cross-sectional views of intermediate stages of a manufacturing process for a semiconductor structure, in accordance with some embodiments.
Figure 12B:
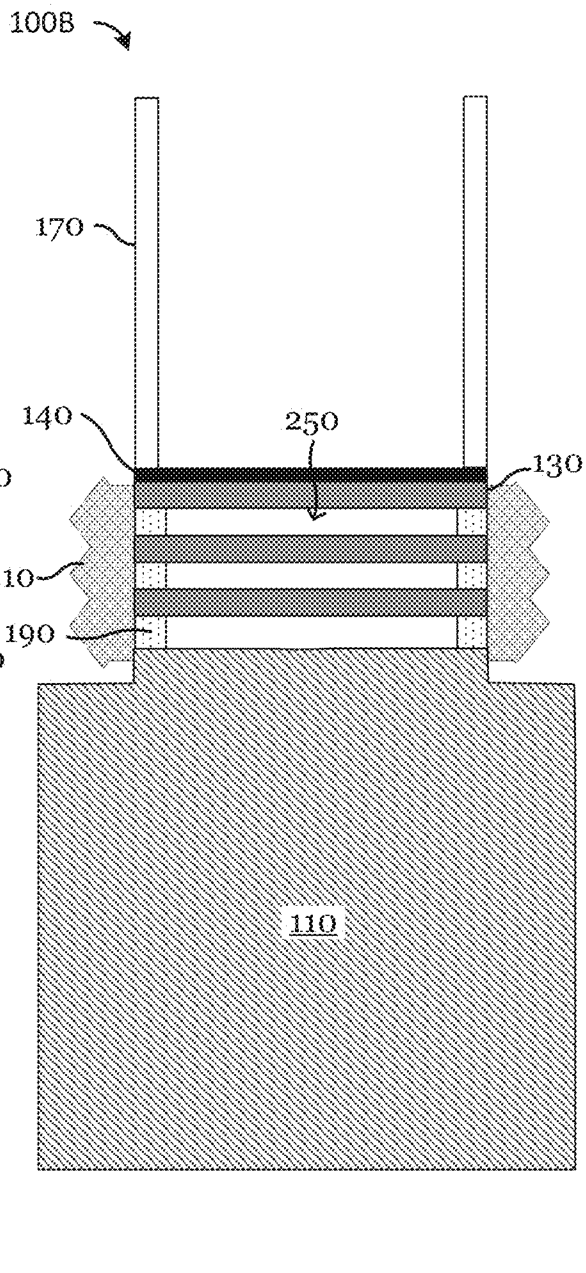

FIG. 11D illustrates experimental data of etched amount decrease versus germanium percentage of SiGe for a first process 310 and a second process 320. The first process 310 may be an oxidation process (e.g., with 75% nitric oxide (NO), argon (Ar), and nitrogen ($N_2$)) at lower pressure (e.g., 5 to 50 Torr) and lower temperature (e.g., 25° C. to 100° C.), and the second process 320 may be an oxidation process with the same gas mixture at higher pressure (e.g., 50 to 90 Torr) and higher temperature (e.g., 100° C. to 300° C.). As illustrated by FIG. 11D, the first process 310 may be able to reduce the etched amount of SiGe with 55% Ge (e.g., SiGe in the source/drain regions 210) by 16.5 nm compared to only reducing the etched amount of SiGe with 15% to 25% Ge (e.g., SiGe in the sacrificial layer 120) by 5.1 nm to 3.5 nm. The second process 320 may be able to reduce the etched amount of SiGe with 55% Ge (e.g., SiGe in the source/drain regions 210) by 1645 nm compared to only reducing the etched amount of SiGe with 15% (e.g., SiGe in the sacrificial layer 120) by 4.0. As such, the first process 310 and the second process 320 may be advantageous for selective oxidation to produce oxidized regions 240 of the source/drain regions 210, as described above with respect to FIG. 11A.

Following from FIGS. 11A and 11B, FIGS. 12A and 12B illustrate cross-sectional views of the semiconductor structure 100 in the short channel region 100A and the long channel region 100B, respectively, after a second channel release process. In various embodiments, the second channel release process removes most or all of the remaining sacrificial material from the sacrificial layers 120 in the short channel region 100A, expanding the voids 230 into voids 250 bounded in a cross-sectional view by the inner spacers 190 and the nanosheets 130. The oxidized regions 240 protect the source/drain regions 210 from damage during the second channel release process due to the selectivity of the etch between the material of the sacrificial layers 120 and the oxidized regions 240, thereby increasing the margin of over-etching.

In some embodiments, the second channel release process is a plasma-less process performed with an etch gas comprising fluorine. In one or more embodiments, the etch step is performed at a chamber pressure in a range of 10 mTorr to 500 mTorr, at a substrate temperature in a range of 0° C. to 55° C., and/or with a process gas comprising hydrogen fluoride (HF), fluorine ($F_2$), chlorine trifluoride ($ClF_3$), argon (Ar), nitrogen ($N_2$), the like, or a combination thereof. In one embodiment, the process time is in a range of 10 seconds to 300 seconds.

In some embodiments, after the second channel release process is complete, a(nother) post-etch thermal treatment is performed. This may be advantageous by removing etch byproducts and providing a clean process environment for subsequent processes, such as metal gate formation (see below, FIGS. 13A-13B). In various embodiments, the post-etch thermal treatment heats the semiconductor structure 100 to a temperature in a range of 100° C. to 200° C., at a chamber pressure in a range of 1000 mTorr to 5000 mTorr, and under a gas flow comprising argon (Ar), nitrogen ($N_2$), the like, or a combination thereof.

Figure 13A:
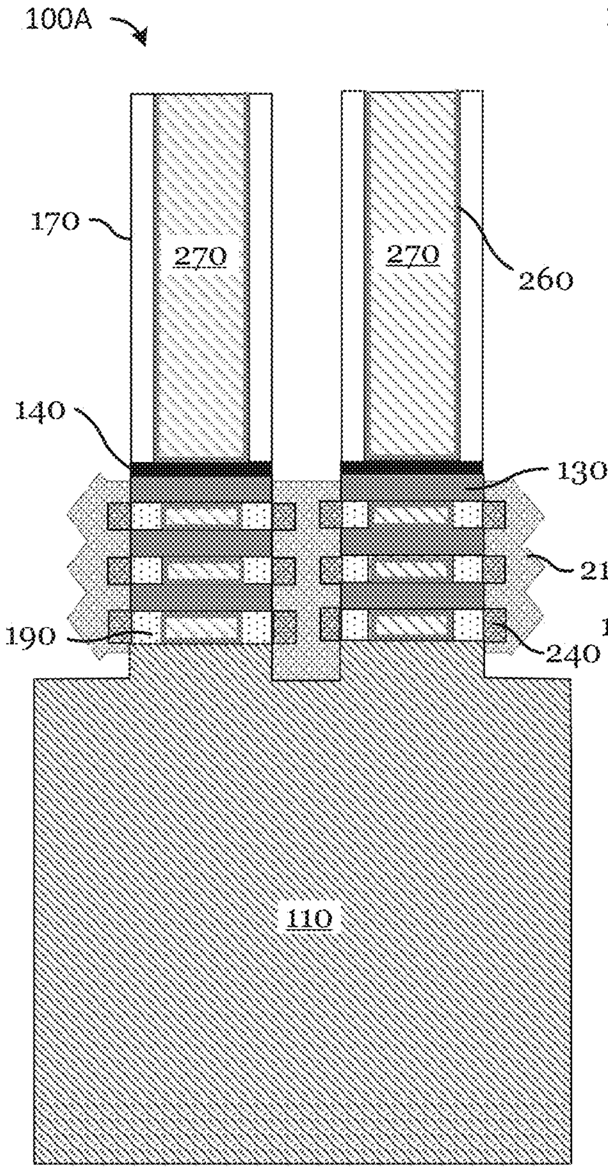
Figure 13B:
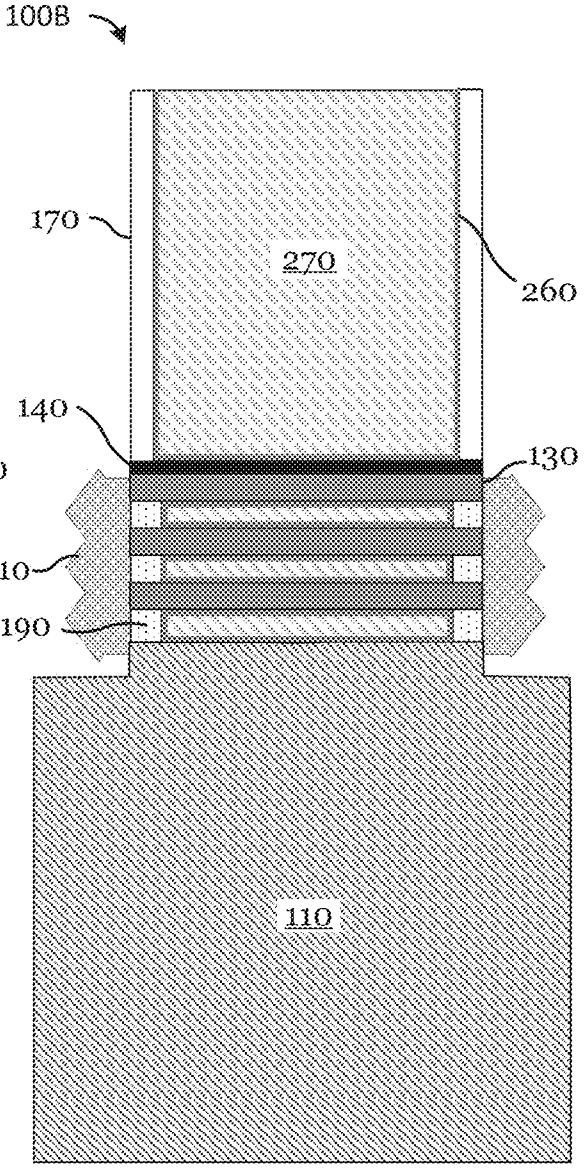

Next, FIGS. 13A and 13B illustrate cross-sectional views of the semiconductor structure 100 in the short channel region 100A and the long channel region 100B, respectively after a replacement gate formation, such as a high-k metal gate (HKMG). The channel release process (see above, FIGS. 10A-12B) frees up space previously occupied by the sacrificial layers 120. This created void space (e.g., voids 220 and voids 250) may be filled with gate dielectric (e.g., high-k dielectric materials) and gate electrode through the HKMG formation in both the short channel region 100A and the long channel region 100B. As an example of a HKMG formation process, first, a high-k dielectric layer 260 is deposited. In some embodiments, the high-k dielectric layer 260 comprises hafnium dioxide ($HfO_2$), $Hf_xSi_yO_zN_w$, or the like. The high-k dielectric layer 260 may be deposited using appropriate deposition techniques such as vapor deposition including atomic layer deposition (ALD), chemical vapor deposition (CVD), physical vapor deposition (PVD), as well as other plasma processes such as plasma enhanced CVD (PECVD), sputtering, the like, or a combination thereof. In various embodiments, an optional insulating layer, such as a silicon oxide layer, is formed beneath the high-k dielectric layer 260.

Next, over the high-k dielectric layer 260, a replacement metal gate (RMG) material 270 is deposited to fill the remainder of the void space and complete the HKMG formation. In various embodiments, the RMG material 270 comprises a combination of several layers, including a workfunction metal and a metallic fill material. In some embodiments, the workfunction metal of the RMG material comprises titanium nitride (TiN), tantalum nitride (TaN), metal alloys such as AlC, TiAl and TiAlC, the like, or a combination thereof. Metal deposition is continued till the remaining recesses are filled with excess metallic fill material. In some embodiments, the metallic fill material comprise a low resistivity metal such as tungsten (W), copper (Cu), cobalt (Co), aluminum (Al), the like, or a combination thereof. In some embodiments, the RMG material 270 may be deposited using a highly conformal process such as an atomic layer deposition (ALD) process. However, any suitable process may be used to form the RMG material 270. After the deposition steps, any excess metal may be removed by a planarizing process such as chemical mechanical planarization (CMP). Subsequently, middle-of-line (MOL)/back-end-of-line (BEOL) processes may be performed, such as to form various inter-metal dielectric layers, gate and source/drain conductive contacts, interconnect structures, the like, or a combination thereof, to the GAAFET device(s) of the semiconductor structure 100. Similar processes may be used for other FET devices such as CFETs and are within the scope of the disclosed embodiments.

Figure 14:
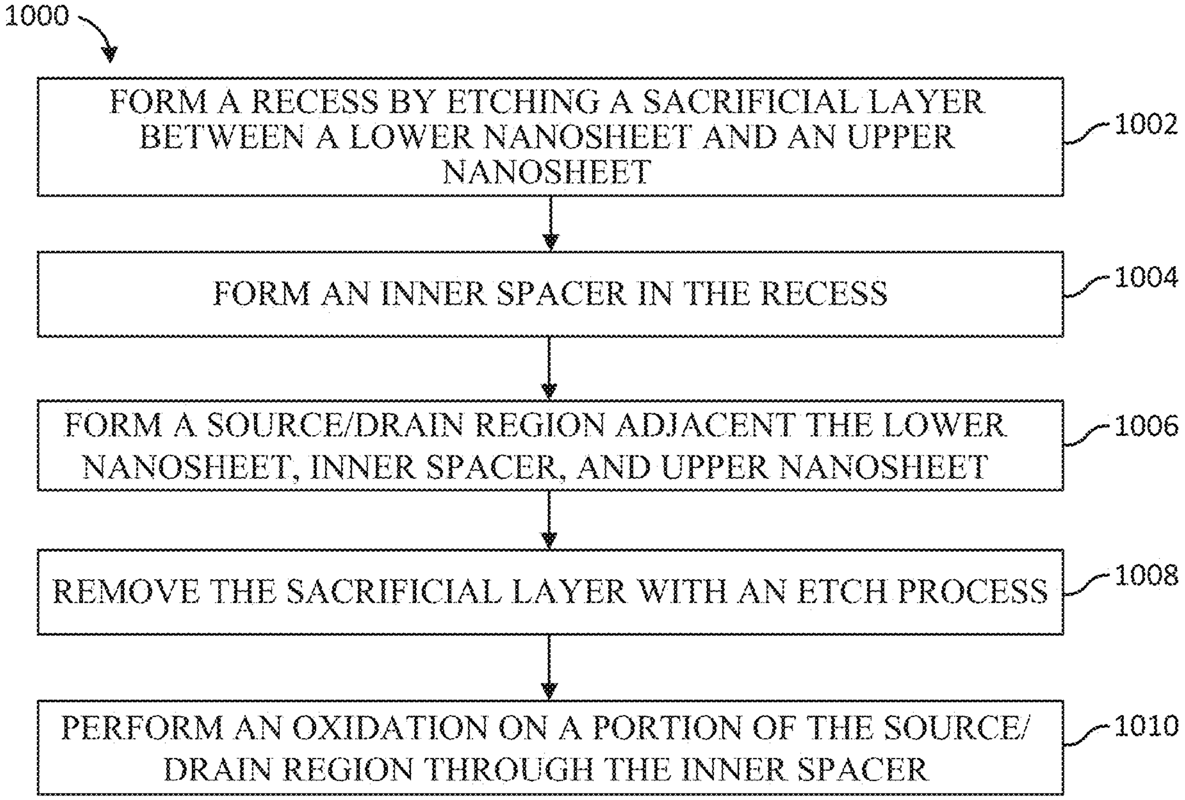
FIG. 14 illustrates a flow chart diagram of a method of processing a substrate, in accordance with some embodiments.

FIG. 14 illustrates a flow chart diagram of a method 1000 for processing a substrate, in accordance with some embodiments. In step 1002, a recess is formed by etching a sacrificial layer, as described above with respect to FIG. 5. The sacrificial layer is between a lower nanosheet and an upper nanosheet. In step 1004, an inner spacer is formed in the recess, as described above with respect to FIGS. 6 and 7A.

In step 1006, a source/drain region is formed adjacent the lower nanosheet, the inner spacer, and the upper nanosheet, as described above with respect to FIG. 8. In step 1008, the sacrificial layer is removed with an etch process, as described above with respect to FIG. 10A. In step 1010, an oxidation is performed on a portion of the source/drain region through the inner spacer, as described above with respect to FIG. 11A.

Figure 15:
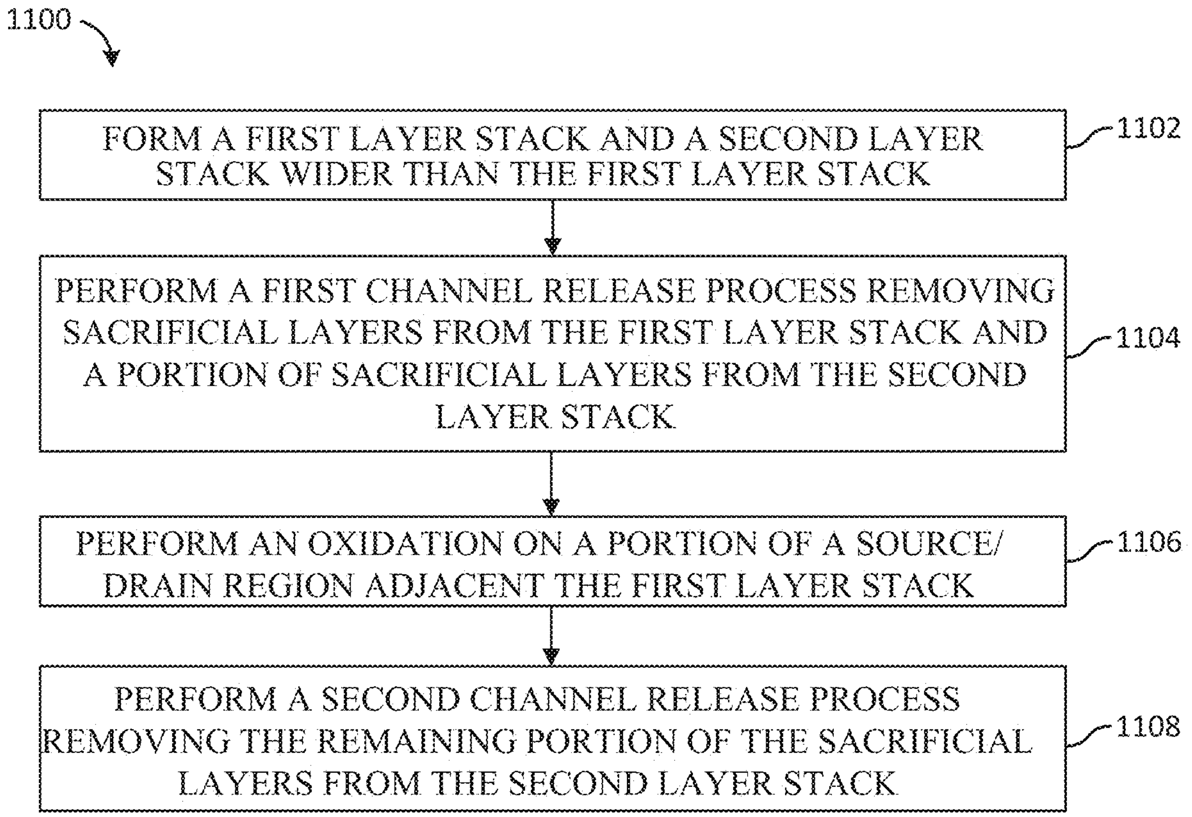
FIG. 15 illustrates a flow chart diagram of a method of processing a substrate, in accordance with some embodiments.

FIG. 15 illustrates a flow chart diagram of a method 1100 for processing a substrate, in accordance with some embodiments. In step 1102, a first layer stack and a second layer stack are formed, as described above with respect to FIGS. 2-4B. The first layer stack comprises alternating layers of first nanosheets and first sacrificial layers, the second layer stack comprises alternating layers of second nanosheets and second sacrificial layers, and the second layer stack is wider than the first layer stack.

In step 1104, a first channel release process is performed on the first layer stack and the second layer stack, as described above with respect to FIGS. 10A-10B. The first channel release process removes the first sacrificial layers from the first layer stack and a portion of the second sacrificial layers from the second layer stack.

In step 1106, an oxidation is performed on a portion of a source/drain region, as described above with respect to FIG. 11A. The source/drain region is adjacent the first layer stack. In step 1108, a second channel release process is performed on the second layer stack, as described above with respect to FIGS. 12A-12B. The second channel release process removes the remaining portion of the second sacrificial layers.

Figure 16:
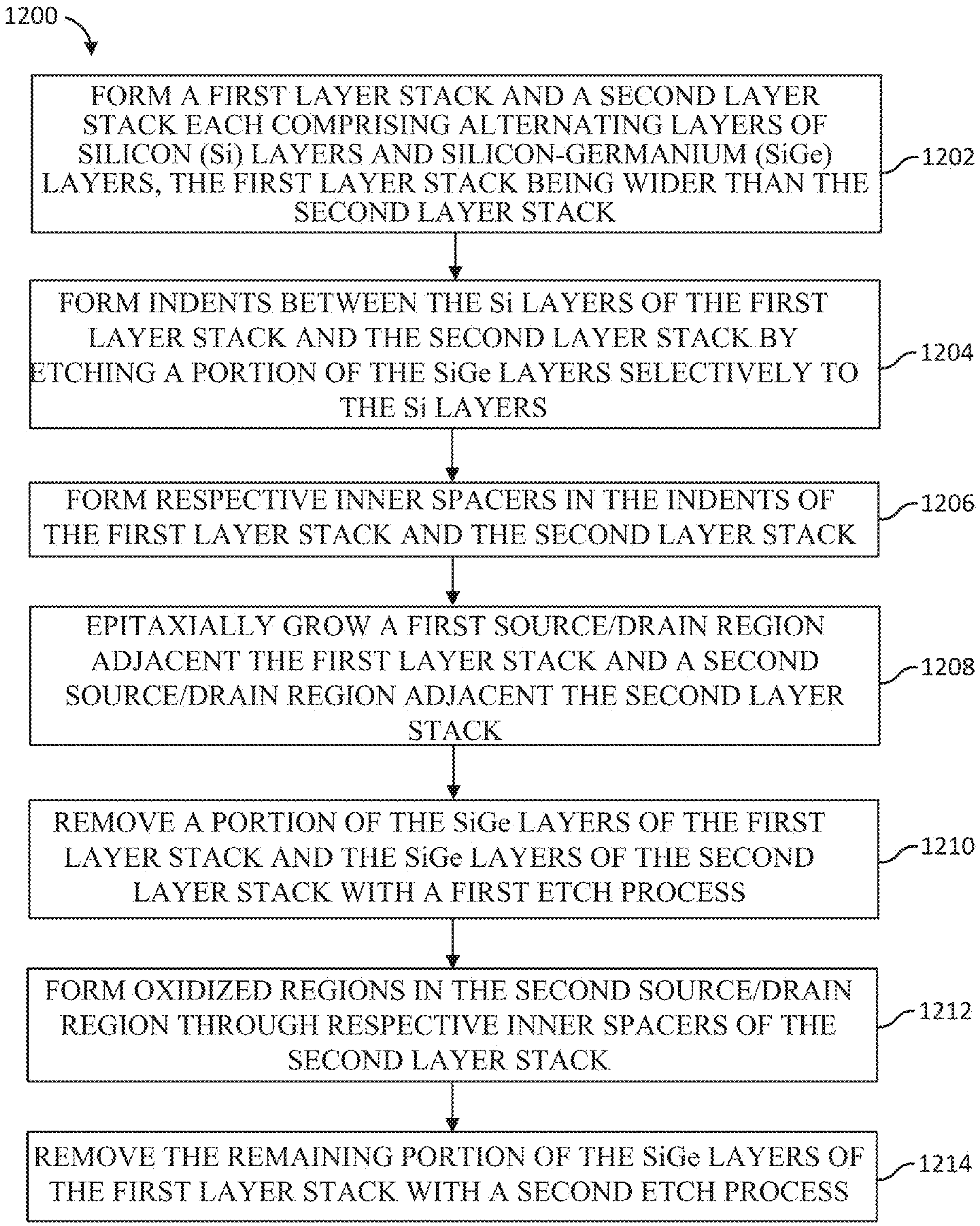
FIG. 16 illustrates a flow chart diagram of a method of processing a substrate, in accordance with some embodiments.

FIG. 16 illustrates a flow chart diagram of a method 1200 for processing a substrate, in accordance with some embodiments. In step 1202, a first layer stack and a second layer stack are formed, as described above with respect to FIGS. 2-4B. The first layer stack and the second layer stack each comprise alternating layers of silicon (Si) layers and silicon-germanium (SiGe) layers, and the first layer stack is wider than the second layer stack.

In step 1204, indents are formed between the Si layers of the first layer stack and the second layer stack by etching a portion of the SiGe layers selectively to the Si layers, as described above with respect to FIG. 5. In step 1206, respective inner spacers are formed in the indents of the first layer stack and the second layer stack, as described above with respect to FIGS. 6-7A. In step 1208, a first source/drain region is epitaxially grown adjacent the first layer stack and a second source/drain region is epitaxially grown adjacent the second layer stack, as described above with respect to FIG. 8.

In step 1210, a portion of the SiGe layers of the first layer stack and the SiGe layers of the second layer stack are removed with a first etch process, as described above with respect to FIGS. 10A-10B. In step 1212, oxidized regions are formed in the second source/drain region through respective inner spacers of the second layer stack, as described above with respect to FIG. 11A. In step 1214, the remaining portion of the SiGe layers of the first layer stack are removed with a second etch process, as described above with respect to FIGS. 12A-12B.

Example embodiments of the disclosure are summarized here. Other embodiments can also be understood from the entirety of the specification as well as the claims filed herein.

Example 1. A method of processing a substrate, the method including: forming a recess by etching a sacrificial layer, the sacrificial layer being between a lower nanosheet and an upper nanosheet; forming an inner spacer in the recess; forming a source/drain region adjacent the lower nanosheet, the inner spacer, and the upper nanosheet; removing the sacrificial layer with an etch process; and performing an oxidation on a portion of the source/drain region through the inner spacer.

Example 2. The method of example 1, where the sacrificial layer and the source/drain region include silicon-germanium (SiGe).

Example 3. The method of example 2, where the germanium percentage of the sacrificial layer is 25% or less.

Example 4. The method of one of examples 2 or 3, where the germanium percentage of the source/drain region is 55% or greater.

Example 5. The method of one of examples 1 to 4, where performing the oxidation includes using a gas including nitric oxide (NO), argon (Ar), and nitrogen ($N_2$).

Example 6. The method of one of examples 1 to 5, where the oxidation is performed at a pressure in a range of 5 Torr to 90 Torr.

Example 7. The method of one of examples 1 to 6, where the oxidation is performed at a temperature in a range of 25° C. to 300° C.

Example 8. A method of processing a substrate, the method including: forming a first layer stack and a second layer stack, the first layer stack including alternating layers of first nanosheets and first sacrificial layers, the second layer stack including alternating layers of second nanosheets and second sacrificial layers, the second layer stack being wider than the first layer stack; performing a first channel release process on the first layer stack and the second layer stack, the first channel release process removing the first sacrificial layers from the first layer stack and a portion of the second sacrificial layers from the second layer stack; performing an oxidation on a portion of a source/drain region, the source/drain region being adjacent the first layer stack; and performing a second channel release process on the second layer stack, the second channel release process removing the remaining portion of the second sacrificial layers.

Example 9. The method of example 8, where the oxidation includes a gas with 75% nitric oxide (NO).

Example 10. The method of example 9, where the gas further includes argon (Ar) and nitrogen ($N_2$).

Example 11. The method of one of examples 8 to 10, where the oxidation is performed at a pressure in a range of 5 Torr to 50 Torr.

Example 12. The method of one of examples 8 to 11, where the oxidation is performed at a temperature in a range of 25° C. to 100° C.

Example 13. The method of one of examples 8 to 12, where the source/drain region includes a higher germanium percentage than the second sacrificial layers.

Example 14. The method of example 13, where the source/drain region includes 55% or more of germanium.

Example 15. The method of one of examples 13 or 14, where the second sacrificial layers include 25% or less of germanium.

Example 16. The method of one of examples 8 to 15, further including forming respective inner spacers adjacent the first sacrificial layers in the first layer stack, and where the portion of the source/drain region is oxidized through the inner spacers.

Example 17. A method of processing a substrate, the method including: forming a first layer stack and a second layer stack, the first layer stack and the second layer stack each including alternating layers of silicon (Si) layers and silicon-germanium (SiGe) layers, the first layer stack being wider than the second layer stack; forming indents between the Si layers of the first layer stack and the second layer stack by etching a portion of the SiGe layers selectively to the Si layers; forming respective inner spacers in the indents of the first layer stack and the second layer stack; epitaxially growing a first source/drain region adjacent the first layer stack and a second source/drain region adjacent the second layer stack; removing a portion of the SiGe layers of the first layer stack and the SiGe layers of the second layer stack with a first etch process; forming oxidized regions in the second source/drain region through respective inner spacers of the second layer stack; and removing the remaining portion of the SiGe layers of the first layer stack with a second etch process.

Example 18. The method of example 17, where forming the oxidized regions includes flowing a gas including 75% nitric oxide (NO) at a pressure in a range of 5 Torr to 50 Torr and a temperature in a range of 25° C. to 100° C.

Example 19. The method of one of examples 17 or 18, where the first etch process, the forming the oxidized regions, and the second etch process are performed in situ.

Example 20. The method of one of examples 17 to 19, where the first etch process, the forming the oxidized regions, and the second etch process are performed without plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

forming a recess by etching a sacrificial layer, the sacrificial layer being between a lower nanosheet and an upper nanosheet;

forming an inner spacer in the recess;

forming a source/drain region adjacent the lower nanosheet, the inner spacer, and the upper nanosheet;

removing the sacrificial layer with an etch process; and performing an oxidation on a portion of the source/drain region through the inner spacer.

2. The method of claim 1, wherein the sacrificial layer and the source/drain region comprise silicon-germanium (SiGe).

3. The method of claim 2, wherein the germanium percentage of the sacrificial layer is 25% or less.

4. The method of claim 2, wherein the germanium percentage of the source/drain region is 55% or greater.

5. The method of claim 1, wherein performing the oxidation comprises using a gas comprising nitric oxide (NO), argon (Ar), and nitrogen ($N_2$).

6. The method of claim 1, wherein the oxidation is performed at a pressure in a range of 5 Torr to 90 Torr.

7. The method of claim 1, wherein the oxidation is performed at a temperature in a range of 25° C. to 300° C.

8. A method of processing a substrate, the method comprising:

forming a first layer stack and a second layer stack, the first layer stack comprising alternating layers of first nanosheets and first sacrificial layers, the second layer stack comprising alternating layers of second nanosheets and second sacrificial layers, the second layer stack being wider than the first layer stack;

performing a first channel release process on the first layer stack and the second layer stack, the first channel release process removing the first sacrificial layers from the first layer stack and a portion of the second sacrificial layers from the second layer stack;

performing an oxidation on a portion of a source/drain region, the source/drain region being adjacent the first layer stack; and performing a second channel release process on the second layer stack, the second channel release process removing the remaining portion of the second sacrificial layers.

9. The method of claim 8, wherein the oxidation comprises a gas with 75% nitric oxide (NO).

10. The method of claim 9, wherein the gas further comprises argon (Ar) and nitrogen ($N_2$).

11. The method of claim 8, wherein the oxidation is performed at a pressure in a range of 5 Torr to 50 Torr.

12. The method of claim 8, wherein the oxidation is performed at a temperature in a range of 25° C. to 100° C.

13. The method of claim 8, wherein the source/drain region comprises a higher germanium percentage than the second sacrificial layers.

14. The method of claim 13, wherein the source/drain region comprises 55% or more of germanium.

15. The method of claim 13, wherein the second sacrificial layers comprise 25% or less of germanium.

16. The method of claim 8, further comprising forming respective inner spacers adjacent the first sacrificial layers in the first layer stack, and wherein the portion of the source/drain region is oxidized through the inner spacers.

17. A method of processing a substrate, the method comprising:

forming a first layer stack and a second layer stack, the first layer stack and the second layer stack each comprising alternating layers of silicon (Si) layers and silicon-germanium (SiGe) layers, the first layer stack being wider than the second layer stack;

forming indents between the Si layers of the first layer stack and the second layer stack by etching a portion of the SiGe layers selectively to the Si layers;

forming respective inner spacers in the indents of the first layer stack and the second layer stack;

epitaxially growing a first source/drain region adjacent the first layer stack and a second source/drain region adjacent the second layer stack;

removing a portion of the SiGe layers of the first layer stack and the SiGe layers of the second layer stack with a first etch process;

forming oxidized regions in the second source/drain region through respective inner spacers of the second layer stack; and removing the remaining portion of the SiGe layers of the first layer stack with a second etch process.

18. The method of claim 17, wherein forming the oxidized regions comprises flowing a gas comprising 75% nitric oxide (NO) at a pressure in a range of 5 Torr to 50 Torr and a temperature in a range of 25° C. to 100° C.

19. The method of claim 17, wherein the first etch process, the forming the oxidized regions, and the second etch process are performed in situ.

20. The method of claim 17, wherein the first etch process, the forming the oxidized regions, and the second etch process are performed without plasma.

* * * * *